(12) United States Patent
Zafar et al.

(10) Patent No.: US 11,448,614 B2
(45) Date of Patent: Sep. 20, 2022

(54) NANOSCALE GRANULARITY FIELD EFFECT TRANSISTOR ARRAY

(71) Applicant: INTERNATIONAL BUSINESS MACHINES CORPORATION, Armonk, NY (US)

(72) Inventors: Sufi Zafar, Briarcliff Manor, NY (US); Steven J. Holmes, Ossining, NY (US); Bruce B. Doris, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 527 days.

(21) Appl. No.: 16/402,206

(22) Filed: May 2, 2019

(65) Prior Publication Data
US 2020/0348256 A1    Nov. 5, 2020

(51) Int. Cl.
*G01N 27/414* (2006.01)
*G01N 27/327* (2006.01)
*H01L 21/02* (2006.01)
*H01L 29/06* (2006.01)
*H01L 21/8232* (2006.01)

(52) U.S. Cl.
CPC ..... *G01N 27/4145* (2013.01); *G01N 27/3278* (2013.01); *H01L 21/02472* (2013.01); *H01L 21/02554* (2013.01); *H01L 21/8232* (2013.01); *H01L 29/0669* (2013.01)

(58) Field of Classification Search
None
See application file for complete search history.

(56) References Cited

U.S. PATENT DOCUMENTS

| 8,093,628 | B2 | 1/2012 | Yang et al. |
| 9,029,132 | B2 | 5/2015 | Khater et al. |
| 2014/0127739 | A1 | 5/2014 | Capelli et al. |
| 2019/0120830 | A1* | 4/2019 | Hoffman ............ G01N 33/5438 |

FOREIGN PATENT DOCUMENTS

WO     2012/170630 A2     12/2012

OTHER PUBLICATIONS

Hideshima, S. et al., "Signal Amplification in Electrochemical Detection of Buckwheat Allergenic Protein Using Field Effect Transistor Biosensor by Introduction of Anionic Surfactant"; Sensing and Bio-Sensing Research (2016); vol. 7 pp. 90-94.

Lee, J. et al., "Two-Dimensional Layered MoS2 Biosensors Enable Highly Sensitive Detection of Biomolecules"; Scientific Reports (2014); vol. 4:7352; 7 pgs.

(Continued)

*Primary Examiner* — J. Christopher Ball
(74) *Attorney, Agent, or Firm* — Intelletek Law Group, PLLC; Gabriel Daniel, Esq.

(57) ABSTRACT

An electrochemical sensor array includes a thermal oxide configured to interface with one or more analytes. There is a transistor device layer that includes a plurality of field effect transistors (FETs) on top of the thermal oxide. A contact and wiring structure layer is on top of the transistor device layer and operative to couple to control nodes of each of the plurality of FETs. The contact and wiring structure are on a side opposite to that of the thermal oxide.

9 Claims, 34 Drawing Sheets

(56) References Cited

OTHER PUBLICATIONS

Wustoni, S. et al., "Sensitive Electrical Detection of Human Prion Proteins Using Field Effect Transistor Biosensor with Dual-Ligand Binding Amplification"; Biosensors and Bioelectronics (2015); vol. 67; pp. 256-262.
Cheng, S. et al., "Label-Free Detection of Tumor Markers Using Field Effect Transistor (FET)-Based Biosensors for Lung Cancer Diagnosis"; Sensors and Actuators (2015); vol. B 212; pp. 329-334.
Zafar, S. et al., "Silicon Nanowire Field Effect Transistor Sensors with Minimal Sensor to Sensor Variations and Enhanced Sensing Characteristics" IBM T.J. Watson Research Center, New York, US (XXXX); 32 pgs.
Zafar, S. et al., "Comparison between Field Effect Transistors and Bipolar Junction Transistors as Transducers in Electrochemical Sensors"; Scientific Reports (2017); vol. 7:41430; 10 pgs. 2017.

\* cited by examiner

NANOSCALE GRANULARITY FIELD EFFECT TRANSISTOR ARRAY

BACKGROUND

Technical Field

The present disclosure generally relates to semiconductor devices, and more particularly, to sensors for biomolecule detection.

Description of the Related Art

The study of biomolecules, which may include proteins or viruses, play an important role in many illnesses, is essential for improved, cost effective disease diagnosis and treatment. In recent years, field effect transistor (FET) based sensors, such as large area planar FET or a back-gated silicon nanowire FETs, have been increasingly used to detect biomolecules.

SUMMARY

According to one embodiment, electrochemical sensor array includes a thermal oxide configured to interface with one or more analytes. A transistor device layer comprising a plurality of field effect transistors (FETs) is on top of the thermal oxide. A contact and wiring structure layer is on top of the transistor device layer and operative to couple to control nodes of each of the plurality of FETs. The contact and wiring structure are on a side opposite to that of the thermal oxide.

In one embodiment, there is a support layer on top of the contact and wiring structure layer and configured to provide support for the electrochemical sensor array.

In one embodiment, the plurality of FETs is operative to provide a spatial mapping of a membrane protein activity in living cells through the contacts and wiring structure layer.

In one embodiment, the plurality of FETs is configured to selectively sense concentrations of ionic biomolecules at a nanoscale granularity.

In one embodiment, the plurality of FETs is divided into different groups, wherein each group is configured to analyze a different analyte.

In one embodiment, the thickness of the thermal oxide is between 2 nm to 3 nm.

In one embodiment, the transistor device layer comprises, for each of the plurality of FETs, a gate, a drain, and a source of the FET.

In one embodiment, each of the plurality of FETs is a Fin Field Effect Transistor.

In one embodiment, the plurality of FETs is configured to provide a distribution of one or more analytes across a sensing surface of the thermal oxide.

According to one embodiment, a method of fabricating an electrochemical sensor includes providing a first wafer comprising: a substrate, a buried oxide on top of the substrate, a transistor device layer on top of the substrate, and a thermal oxide. A second wafer is provided, comprising: a first layer, a second layer on top of the first layer, and a third layer on top of the second layer. The first wafer is bonded with the second wafer such that the thermal oxide of the first wafer is closest to the third layer of the second wafer. The substrate and the buried oxide of the first wafer are removed. Contact and wiring structure are provided on top of the transistor device layer. The substrate layer of the second wafer are removed, as well as the third layer of the second wafer.

In one embodiment, in the second wafer, the first layer is a substrate and the second layer is oxide. The third layer of the second wafer may comprise polycrystalline silicon.

In one embodiment, the thermal oxide has a thickness of 2 to 3 nm.

In one embodiment, the thermal oxide is thermally grown and not thinned by a chemical mechanical polishing process.

In one embodiment, the thermal oxide is configured to interface with one or more analytes.

In one embodiment, the third layer of the second wafer comprises amorphous silicon.

In one embodiment, the transistor device layer comprises a plurality of field effect transistors.

In one embodiment, each of the plurality of FETs is a Fin Field Effect Transistor.

In one embodiment, the contact and wiring structure are configured to couple to source and drains of the plurality of field effect transistors.

In one embodiment, a support layer is provided on top of the contact and wiring structure layer to provide support for the electrochemical sensor array.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
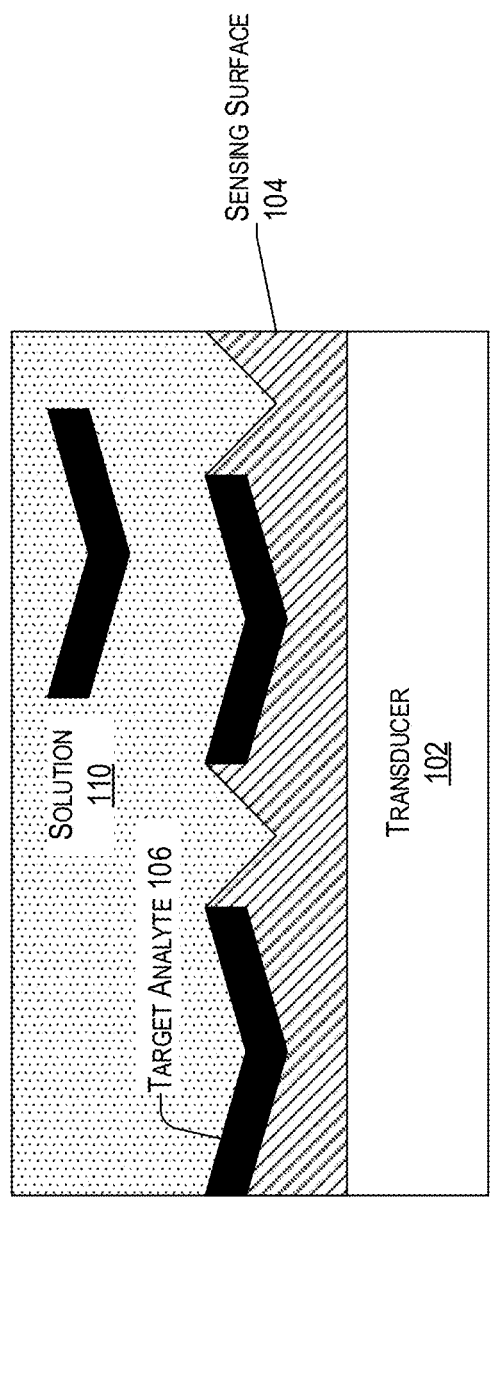
FIG. 1 illustrates a simplified cross-section view of an electrochemical sensor system.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure relates to electrochemical sensors for biomolecule detection. Silicon nanowire field effect transistor (FET) sensors have demonstrated their ability for rapid and label free detection of proteins, nucleotide sequences, and viruses at ultralow concentrations with the potential to be a transformative diagnostic technology. Their nanoscale size gives them ultralow detection ability but also makes their fabrication challenging with large sensor to sensor variations, thus limiting their commercial applications.

A field effect transistor (FET) based sensor, such as large area planar FET or a back-gated silicon nanowire FET, may be used to detect biomolecules by measuring the drain current in the sub-threshold regime where the drain current has an exponential dependence on the gate voltage of the FET. A large area planar FET may have limited sensitivity, and may therefore detect only high concentrations of biomolecules. A back-gated silicon nanowire FET exhibits improved sensitivity in comparison to large area planar FET based sensors. In a back-gated silicon nanowire FET, silicon nanowire forms the sensing surface, buried oxide act as the gate dielectric, and silicon substrate act as the gate. The sensitivity of a back-gated nanowire FET may be degraded due to two main factors: (i) a large sub-threshold slope due to the thick buried oxide that acts as the gate dielectric, and (ii) formation of the inversion layer at the silicon/oxide interface such that is located away from the sensing surface of the silicon channel. Since these factors are inherent structural features of a back-gated silicon nanowire FET, its sensitivity can typically only be enhanced by reducing the silicon nanowire thickness. However, reduction in silicon nanowire thickness causes the sensing area to decrease, resulting in slower response times, and also making the wires relatively fragile. Accordingly, known back-gated silicon nanowire FET sensors have an inherent structural design disadvantage for biomolecule sensing applications.

In one embodiment, the electrochemical sensors discussed herein include two basic components, (i) the sensing surface (or receptor), and a (ii) transducer. In this regard, FIG. 1 illustrates a simplified cross-section view of an electrochemical sensor system 100. The system 100 includes a transducer 102, a sensing surface 104, and a target analyte 106 that is in a solution 110, sometimes referred to herein as a biological fluid, bio-sample, or biomolecule. The sensing surface 104 interacts with the target analyte 106 and the transducer 102 converts this interaction into a readable electronic signal. The sensor performance characteristics depend on both the components. The sensor selectivity and affinity towards the target analyte depends on the sensing surface because the analyte interacts at the sensing surface, as illustrated in FIG. 1. Other performance metrics such as sensitivity, resolution, and calibration depend on both components.

The electrochemical sensors discussed herein can selectively sense the concentrations of ionic biomolecules with nanoscale resolution. These nanoscale sensors can map ion channel activity across the surface of a cell membrane, represented by sensing surface 104. In one aspect, the FET is built on the face of the sensor device, and the wiring to provide nanoscale granularity between the devices is formed behind or beneath the active array of FET sensors, described in more detail later.

Figure 2:
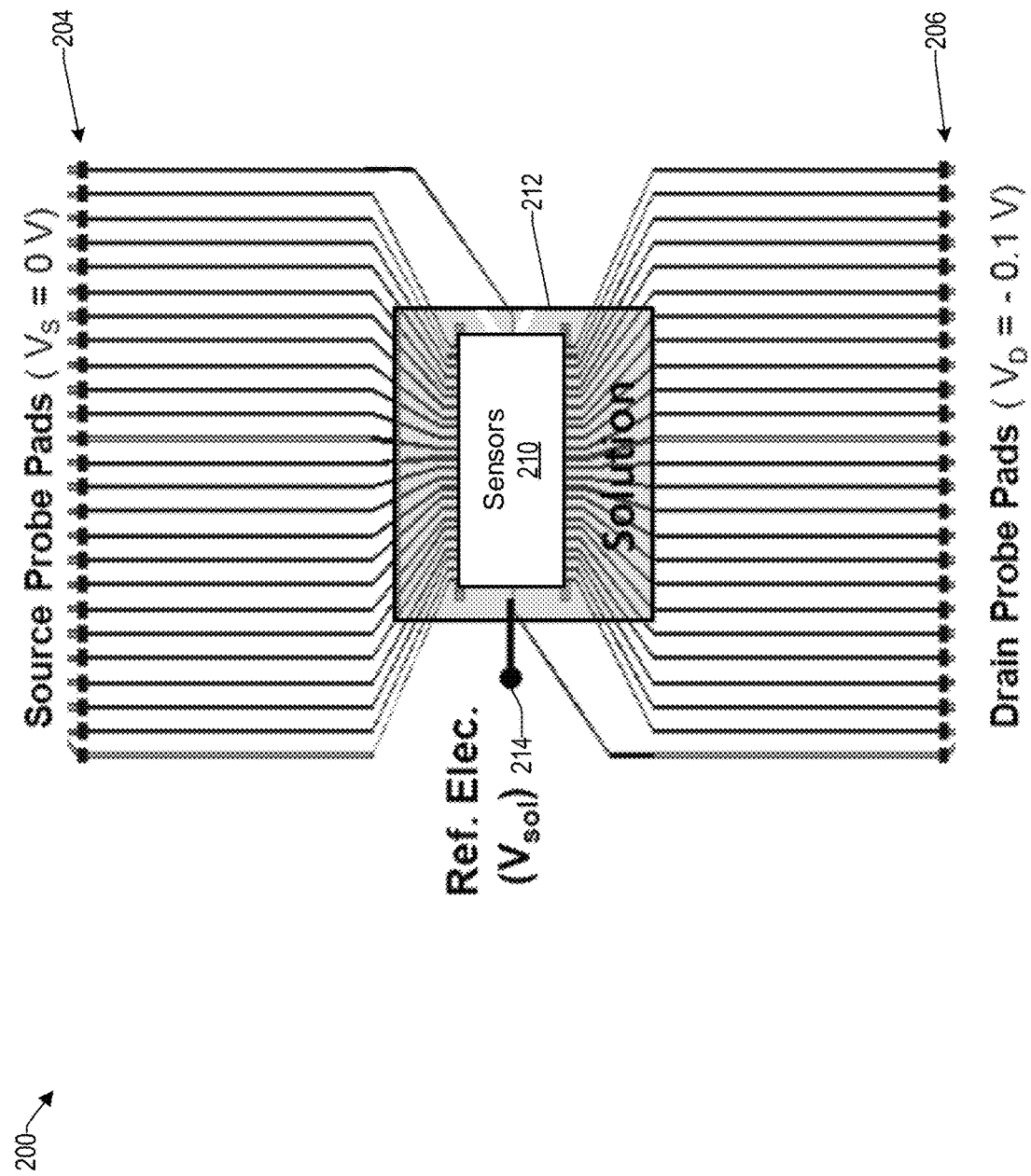
FIG. 2 provides an example schematic of nanowire electrochemical sensors.

To better understand the features of the present application, it may be helpful to briefly discuss known techniques of providing an array of biochemical sensors. To that end, FIG. 2 provides an example schematic 200 of nanowire electrochemical sensors 210. For example, $V_{sol}$ 214 is a gate voltage applied to a reference electrode immersed in a solution 212. VD and VS are voltages applied to the drain 206 and source 204 pads, respectively. As illustrated in FIG. 2, known electrochemical sensor arrays typically include a "well" represented by solution 212 over the devices (e.g., FET) of the sensors 210, wherein the wires and pads 204 and 206 extend laterally out from the sensor 210 region.

Figure 3B:
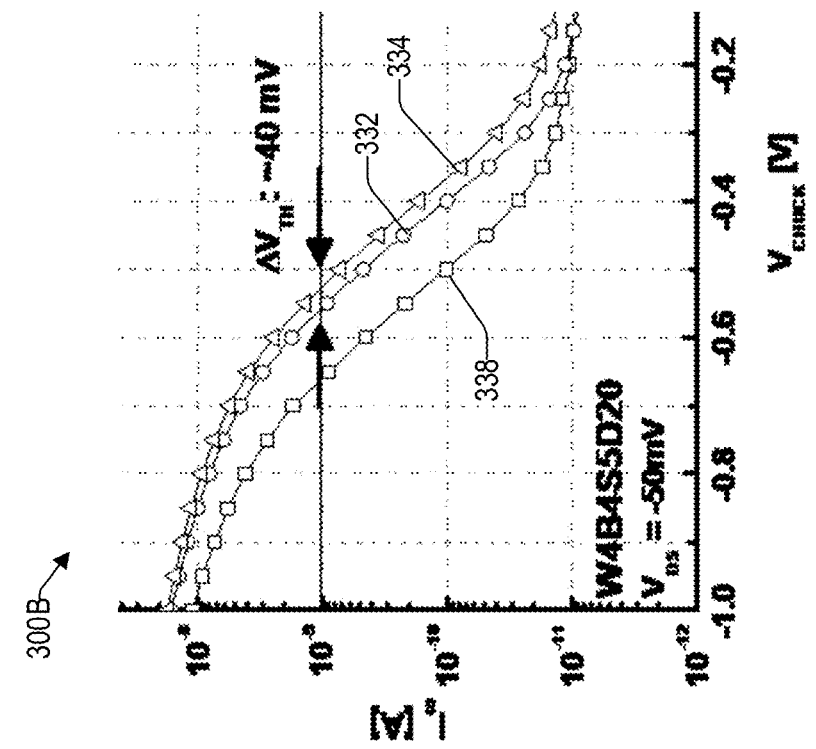
FIG. 3B illustrates a graph of a sensing signal of an electrochemical sensor of FIG. 3A at different voltages.
Figure 3A:
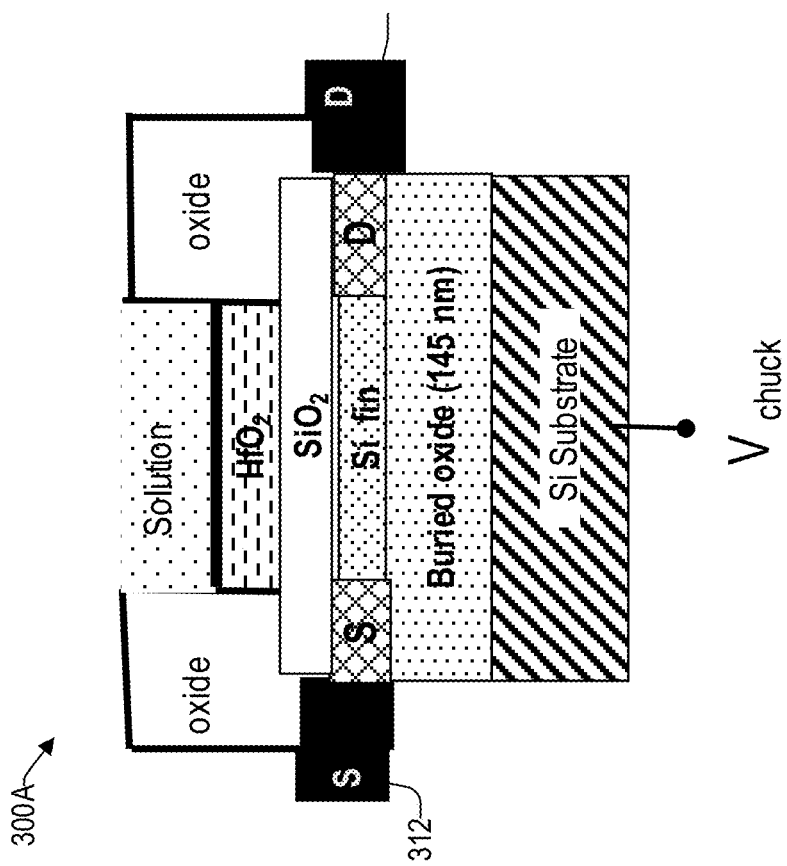
FIG. 3A is a cross-section view of a known field effect transistor electrochemical sensor.

FIG. 3A is a cross-section view of a known FET electrochemical sensor 300A. As illustrated in FIG. 3A, known electrochemical sensors have a source 312 and drain 314 that are on a same side as that of the sensing elements, thereby using a substantial amount of chip real estate and preventing a tight sensor array.

Further, known electrochemical sensors 300A may be subject to hysteresis and drifts in the drain current. In this regard, FIG. 3B illustrates a graph 300B of a sensing signal of the electrochemical sensor of FIG. 3A at different voltages. For example, curves 332 and 334 indicate a same electrochemical sensor (e.g., similar to that of FIG. 3A) that exhibits hysteresis of about 40 mV when the substrate voltage (i.e., $V_{Chuck}$) is varied from −1V to −0.2V and then back from −0.2V to −1V. Further, there is a threshold voltage drift between different sensors, represented by curve 338. For example, the hysteresis and the drift may be attributed to an inferior silicon (Si)/buried oxide (BOX) interface. In contrast, in one aspect of the present disclosure, the wires and pads extend from under the sensor region. In this way, substantial chip area is saved and a denser electrochemical sensor array structure is obtained.

In one embodiment, the FET array discussed herein is fabricated with its associated wiring circuits on buried oxide silicon substrate. The silicon substrate is a modified version of buried oxide, created by bonding two separate wafer slices together, with a thin high-quality gate oxide formed on the binding surface of one slice, and amorphous silicon over buried oxide and the surface on the opposing slice. The silicon substrate is then removed by using, for example, chemical-mechanical polishing and/or wet etch techniques, from the backside of the wafer, to expose the buried oxide surface. The buried oxide surface is wet etched, stopping on a layer of amorphous silicon. In this way, the wiring and the pads can be provided at an end that is opposite to that of the sensing elements of the electrochemical sensor. The techniques described herein may be implemented in a number of ways. Example implementations are provided below with reference to the following figures.

Example Layers of an Electrochemical Sensor

Figure 4:
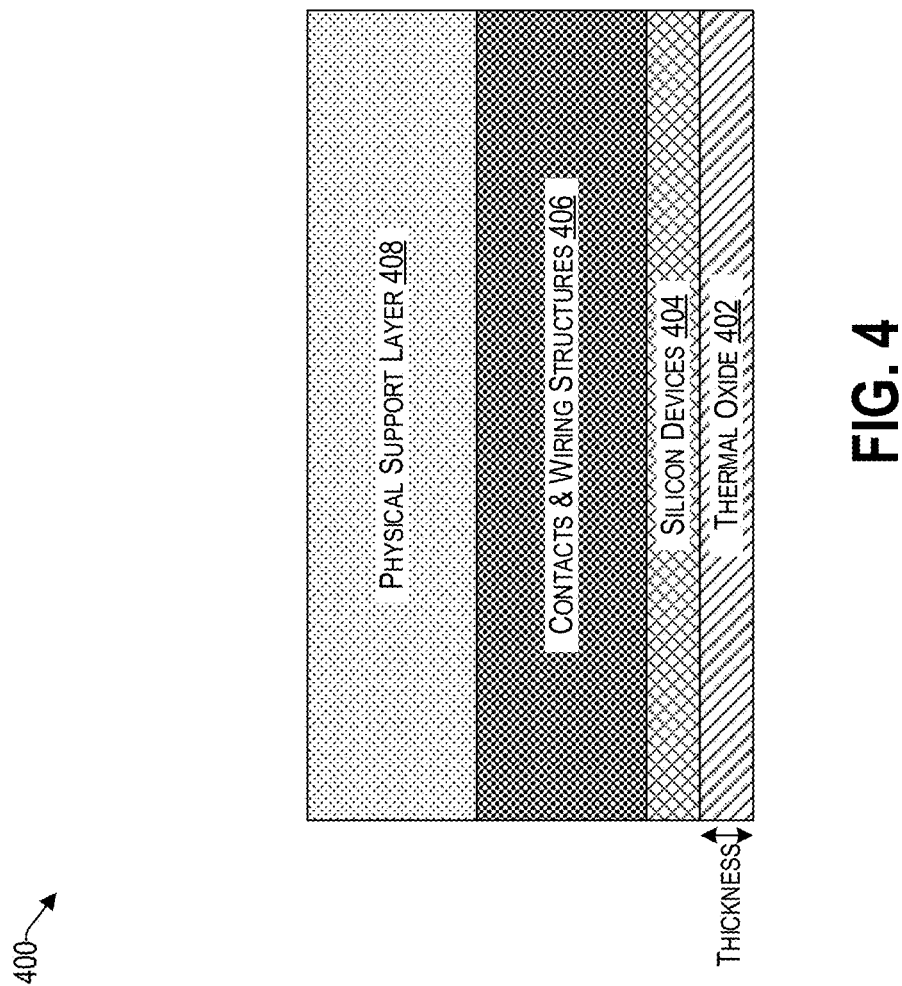
FIG. 4 is a simplified cross-section view of the different layers of an electrochemical sensor, consistent with an illustrative embodiment.

Reference now is made to FIG. 4, which is a simplified cross-section view of the different layers of an electrochemical sensor, consistent with an illustrative embodiment. The topology 400 includes a thermal oxide layer 402, silicon devices layer 404 on top of the thermal oxide layer 402, and layer for contact and wiring structure 406 on top of the silicon devices layer 404. For example, the physical support layer 408 would be patterned around the bond pads. Alternatively, or in addition, there would be openings through the physical support layer 408 to provide access to the contacts and wiring structure 406.

In one embodiment, the thickness of the thermal oxide 402 is between 2 to 3 nm. The thermal oxide 402 provides an interface between the analyte and the silicon devices 404 layer, sometimes referred to herein as the transistor device layer. The thickness of the thermal oxide 402 relates to the threshold voltage behavior of the channel of the FETs. As the gate thermal oxide thickness increases, the threshold voltage increases with an accompanying increase in use voltage. Also, sub-threshold swing decreases with increasing gate oxide thickness, which negatively impacts sensitivity. On the other hand, as the gate oxide thickness decreases, the gate leakage current increases which may negatively impact sensor lifetime. Applicants have identified that a thermal oxide 402 thickness of 2 to 3 nm provides a good tradeoff. The Silicon device layer 404 represents the various components of a transistor (e.g., FET), such as the gate, drain, and source. The contact and wiring structure 406 allow the information from the drain and source of the silicon device layer 404 to be accessed. In some embodiments, there is a physical support layer 408 that is operative to provide structural support to the layers below. Whether a physical support layer 408 is included and the thickness thereof, is based on the environment in which the electrochemical sensor 400 is operated.

Example Process for an Electrochemical Sensor Array

Figure 5:
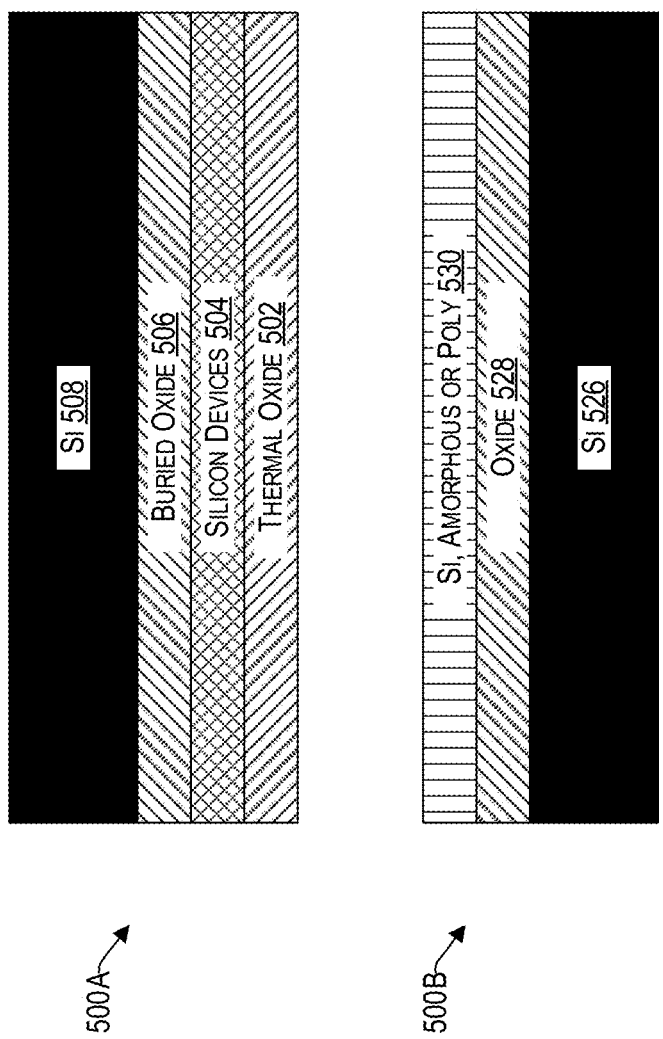
FIG. 5 illustrates two separate wafers that have not been coupled together, consistent with an illustrative embodiment.

With the foregoing description of an example electrochemical sensor array structure 400, it may be helpful to discuss an example process of manufacturing the same. To that end, FIGS. 5 to 12 illustrate various steps in the manufacture of an electrochemical sensor array, consistent with exemplary embodiments. In particular, FIG. 5 illustrates two separate wafers 500A and 500B that have not been coupled together. The second wafer 500B includes a first layer, which is a substrate 526. In various embodiments, the substrate 526, may comprise any suitable material or combination of materials, such as doped or undoped silicon, glass, dielectrics, etc. For example, the substrate 526 may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate 526 include, without limitation, sapphire, aluminum oxide, germanium, gallium arsenide (GaAs) or any of the other III-V periodic table compounds, indium phosphide (InP), silicon carbide (SiC), an alloy of silicon and germanium, etc. The substrate 526 can act as a conductor or an insulator, depending on the materials and concentrations chosen. Thus, as used herein, the term substrate 526 refers to a foundation upon which various semiconductor structures can be built.

There is an oxide layer 528 on top of the silicon layer 526. There is an amorphous silicon (Si) or poly layer 530 on top of the oxide layer.

The first wafer 500A is flipped with respect to the second wafer 500B, such that its substrate 508 is on top while the thermal oxide layer 502 faces the third layer of the second wafer 500B. The first wafer includes a thermal oxide layer 502, silicon devices layer 504 on top of the thermal oxide layer 502, a buried oxide layer 506 on top of the silicon devices layer 504, and a substrate, which may be similar to the substrate of the second wafer 500B. In one embodiment, the thickness of the thermal oxide 402 is between 2 to 3 nm. The thermal oxide 402 provides an interface between the analyte and the silicon devices 404.

Figure 6:
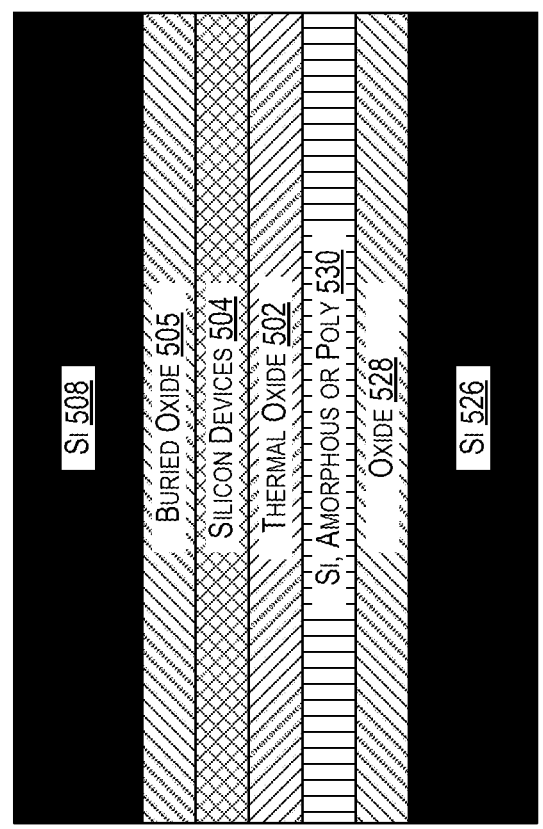
FIG. 6 illustrates a semiconductor structure where the first wafer and the second wafer are bonded together.

FIG. 6 illustrates a semiconductor structure 600 where the first wafer and the second wafer are bonded together. For example, direct bonding, sometimes referred to as fusion bonding, may be used.

Figure 7:
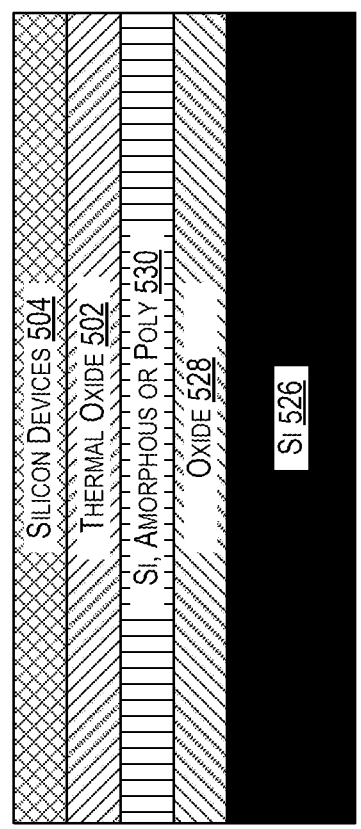
FIG. 7 illustrates a semiconductor structure where the top two layers have been removed.

FIG. 7 illustrates a semiconductor structure 700 where the top two layers have been removed. More particularly, the substrate (e.g., Si) layer 508 and the buried oxide layer 505 are removed. In various embodiments, wet etch and/or plasma etch may be used to remove the Si and BOX layers. The Si and BOX layers may be removed in a single step or each layer separately.

Figure 8:
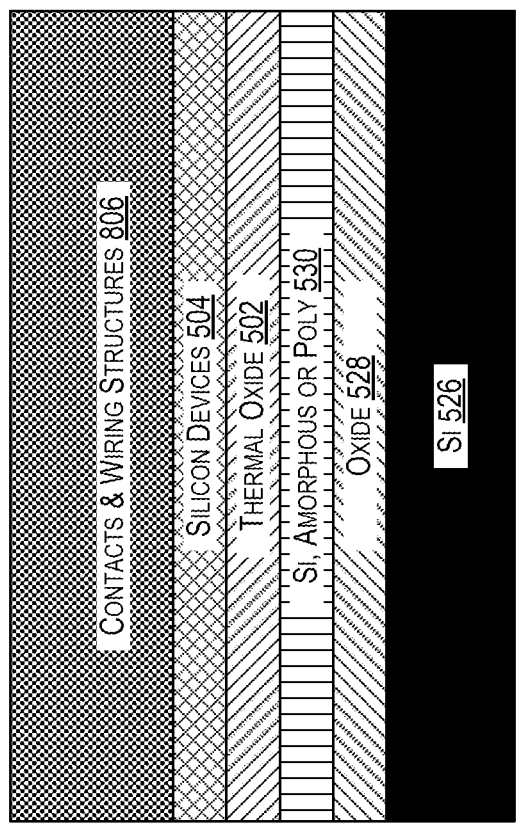
FIG. 8 illustrates a semiconductor structure that includes contact and wiring structure that are created on the silicon devices.

FIG. 8 illustrates a semiconductor structure 800 that includes contact and wiring structure 806 that are created on the silicon devices. The material of the contact and wiring structure 806 is configured to be electrically conductive and may comprise any suitable material or combination of materials. For example, the contacts and/or wiring structures 806 may comprise graphene, aluminum (Al), titanium (Ti), platinum (Pt), and/or gold (Au), or a combination thereof. The contact and wiring structure 806 may be formed using conventional semiconductor processing techniques, such as electron beam evaporation combined with a lift-off process, sputtering. The material of the contacts and wiring is not limited to the materials and processes described herein. Other suitable materials and/or formation processes are within the scope of the present disclosure.

Figure 9:
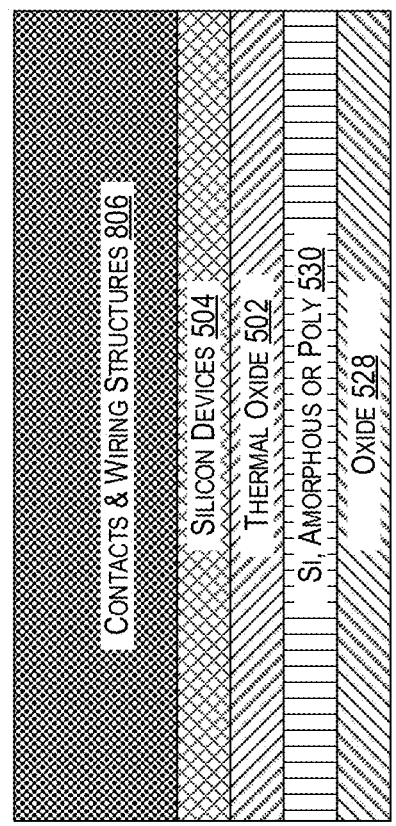
FIG. 9 illustrates a semiconductor structure where the lower substrate has been removed.

FIG. 9 illustrates a semiconductor structure 900, where the lower substrate (e.g., Si) has been removed. For example, wet etch or chemical mechanical polishing/planarization (CMP) may be used to remove the lower substrate.

Figure 10:
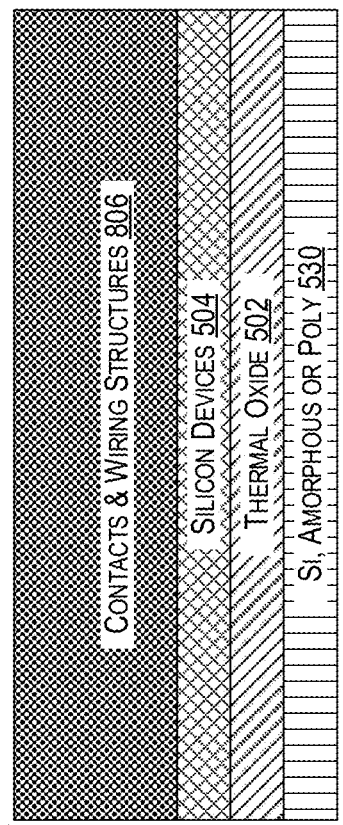
FIG. 10 illustrates a semiconductor structure where the buried oxide layer has been removed.

FIG. 10 illustrates a semiconductor structure 1000, where the buried oxide layer has been removed. For example, Dilute Hydrofluoric Acid (DHF) can be used to remove the silicon oxide layer to the amorphous silicon layer or poly layer 530.

Figure 11:
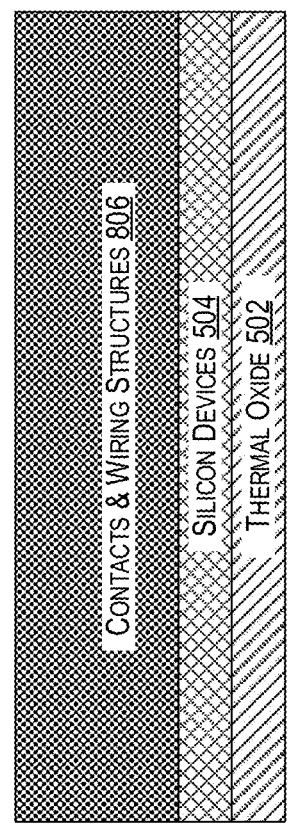
FIG. 11 illustrates a semiconductor structure where the amorphous silicon or polycrystalline silicon layer is removed.

FIG. 11 illustrates a semiconductor structure 1100, where the amorphous Si or polycrystalline silicon layer 530 is removed. For example, chemical-mechanical polishing and/or wet etch techniques can be used to remove the Si or polycrystalline silicon layer 530, thereby leaving the thermal oxide 502 exposed and able to function as an active device region for the silicon devices layer 504.

Figure 12:
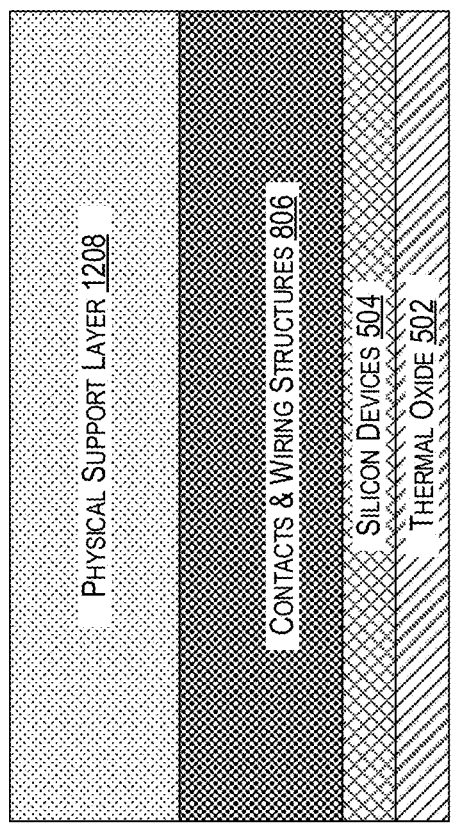
FIG. 12 illustrates a semiconductor structure having an additional physical support layer on top of the contact and wiring structure.

In some scenarios, the three layers (i.e., thermal oxide 502, silicon devices 504, and contact and wiring structure 806) may not provide sufficient rigidity. In this regard, FIG. 12 illustrates a semiconductor structure 1200 having an additional physical support layer on top of the contact and wiring structure 806. The physical support layer 1208 is operative to provide structural support to the layers below.

Figure 13:
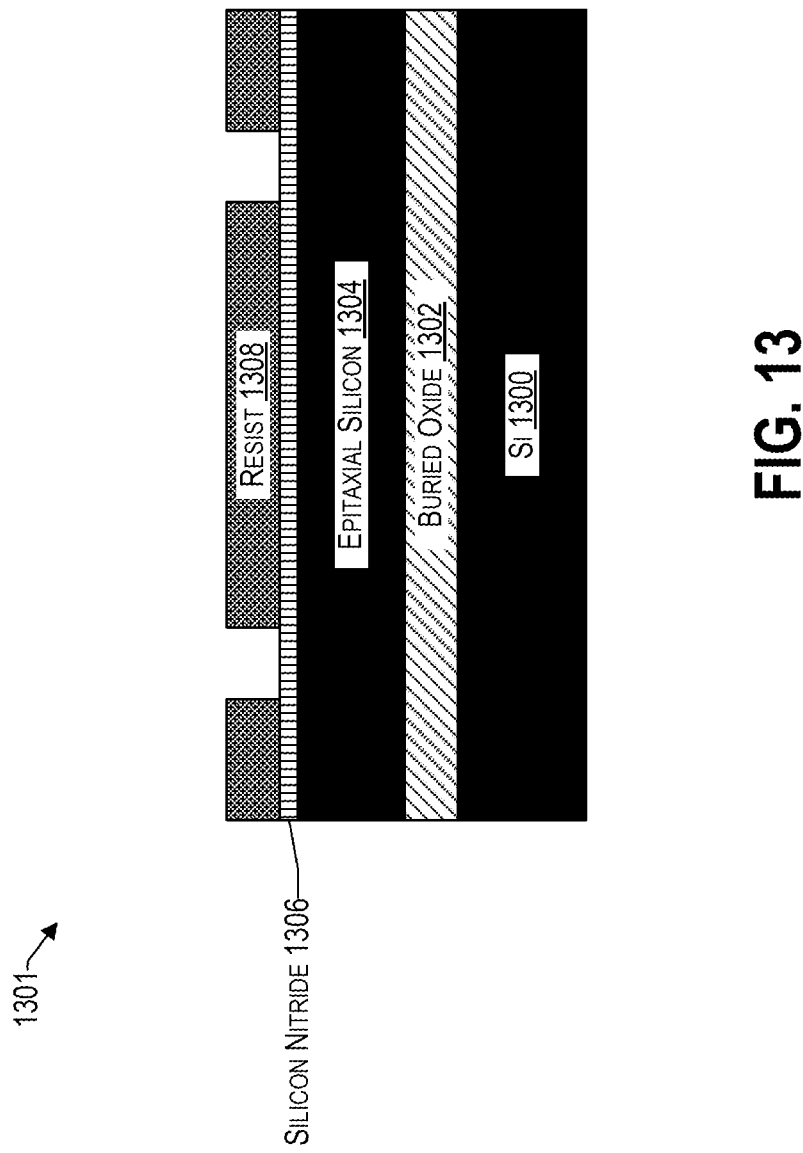
FIG. 13 illustrates a semiconductor structure of a first wafer that can be used for an electrochemical sensor array.

For simplicity, the foregoing discussion of the manufacture of an example electrochemical sensor array structure omitted a detailed discussion of the manufacture of the silicon devices layer 504. For completeness, FIGS. 13 to 34 provide more detailed steps in the manufacture of an electrochemical sensor array with a focus on the manufacture of the silicon devices layer 504 mentioned previously. To that end, FIG. 13 illustrates a semiconductor structure 1301 of a first wafer that can be used for an electrochemical sensor array. The semiconductor structure 1301 is a rotated version of first wafer 500A of FIG. 5 before the thermal oxide 502 has been deposited.

The first wafer includes a first layer, which is a substrate 1300. In various embodiments, the substrate 1300, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

There is a buried oxide layer 1302 on top of the substrate 1300, which is depicted by way of example only and not by way of limitation as Si. There is an epitaxial silicon layer 1304 on top of the buried oxide 1302. There is a silicon nitride layer 1306 on top of the epitaxial silicon layer 1304. An etching mask layer, referred to herein as a resist layer 1308, is deposited with an appropriate pattern to facilitate the removal of layers that are not protected thereby. The photoresist layer 1308 includes a pattern for shallow trench isolation of the FET devices. For example, as is understood by those of ordinary skill in the art, a mask layer may be provided by forming a layer of photoresist material on the silicon nitride layer 1306, exposing the photoresist material 1308 to a pattern of light, and developing the exposed photoresist material.

Figure 14:
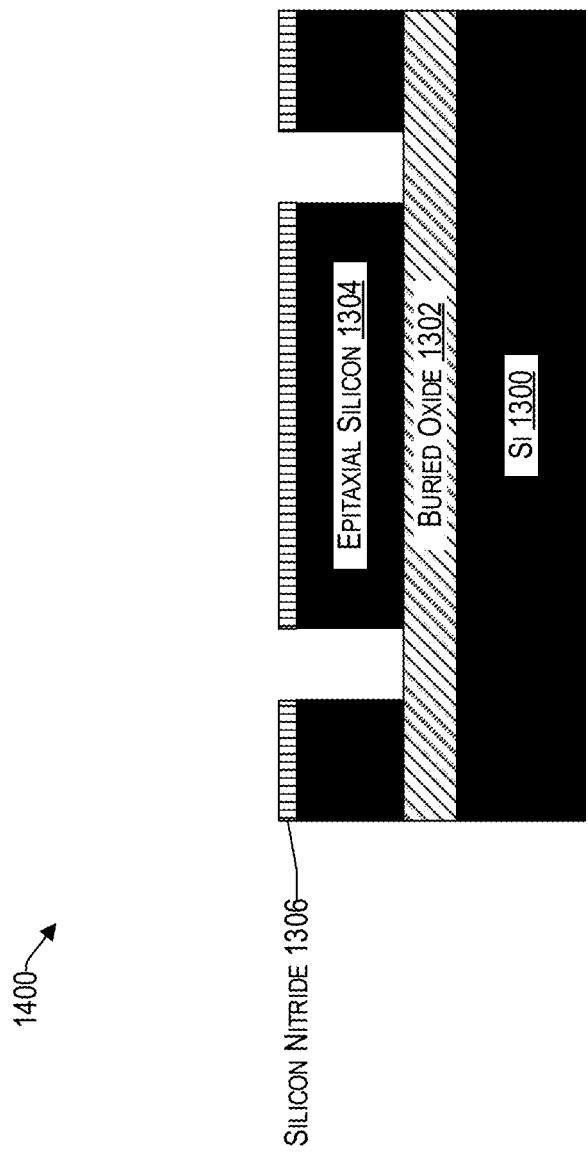
FIG. 14 illustrates a semiconductor structure where the silicon nitride layer and the epitaxial silicon layer have been removed based on a photoresist pattern of FIG. 13.

FIG. 14 illustrates a semiconductor structure 1400 where the silicon nitride layer 1306 and the epitaxial silicon layer 1304 have been removed based on the photoresist pattern of layer 1308 of FIG. 13. An etching process, such as a reactive ion etch (RIE), may be used to form patterns (e.g., openings) by removing portions of the silicon nitride layer 1306 and the epitaxial silicon layer 1304. After etching, the mask layer 1308 is removed using a conventional plasma ashing or stripping process. Accordingly, the pattern of the photoresist layer 1308 facilitates the removal of the silicon nitride 1306 and epitaxial silicon 1304, in areas where the photoresist layer 1308 has not been deposited. The silicon nitride layer 1306 acts as a CMP stop layer.

Figure 15:
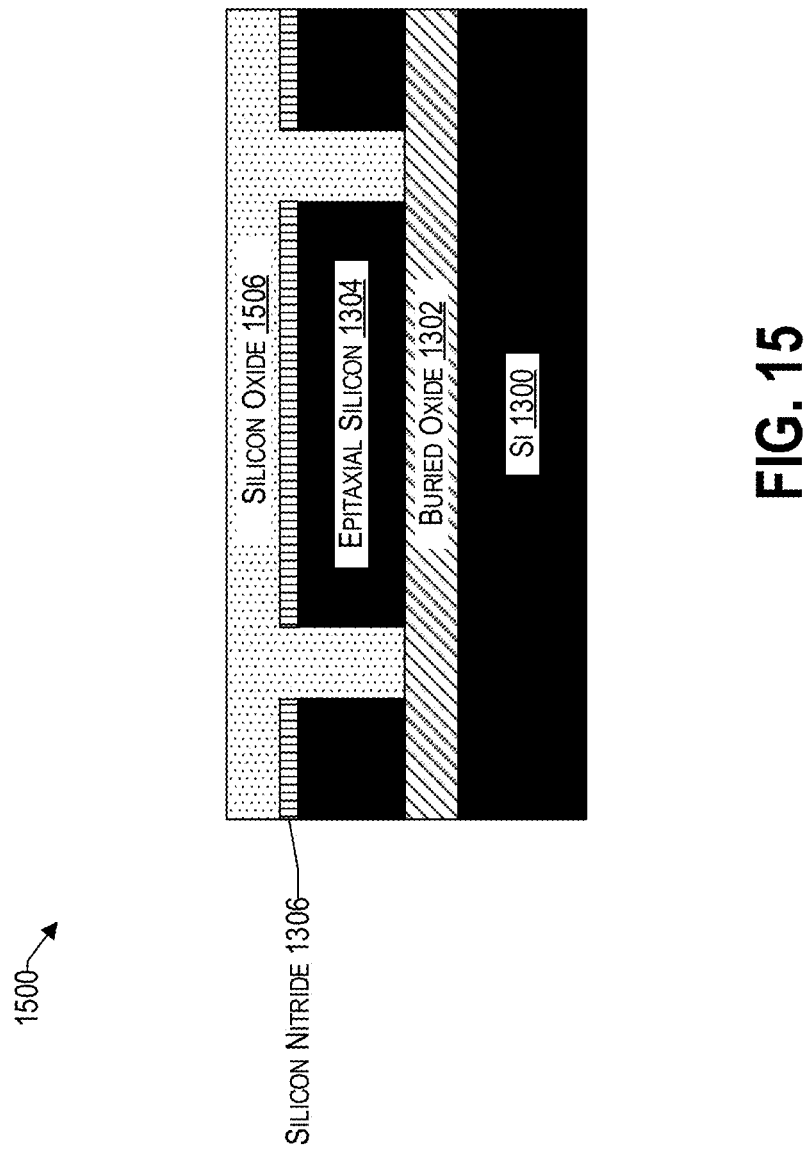
FIG. 15 illustrates a semiconductor structure that includes a silicon oxide isolation film that goes on top of the silicon nitride layer and fills the openings left behind from the processing step of FIG. 14.
Figure 16:
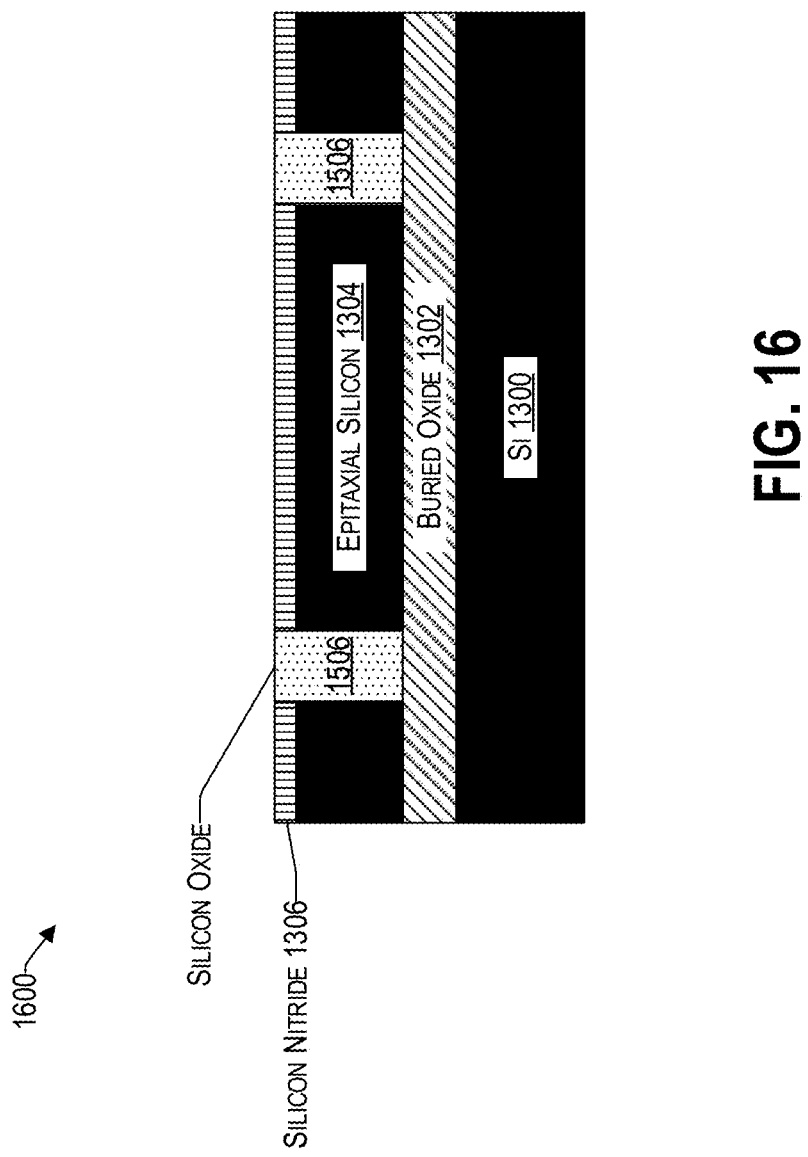
FIG. 16 illustrates a semiconductor structure where the silicon oxide that is above the silicon nitride layer is removed.
Figure 17:
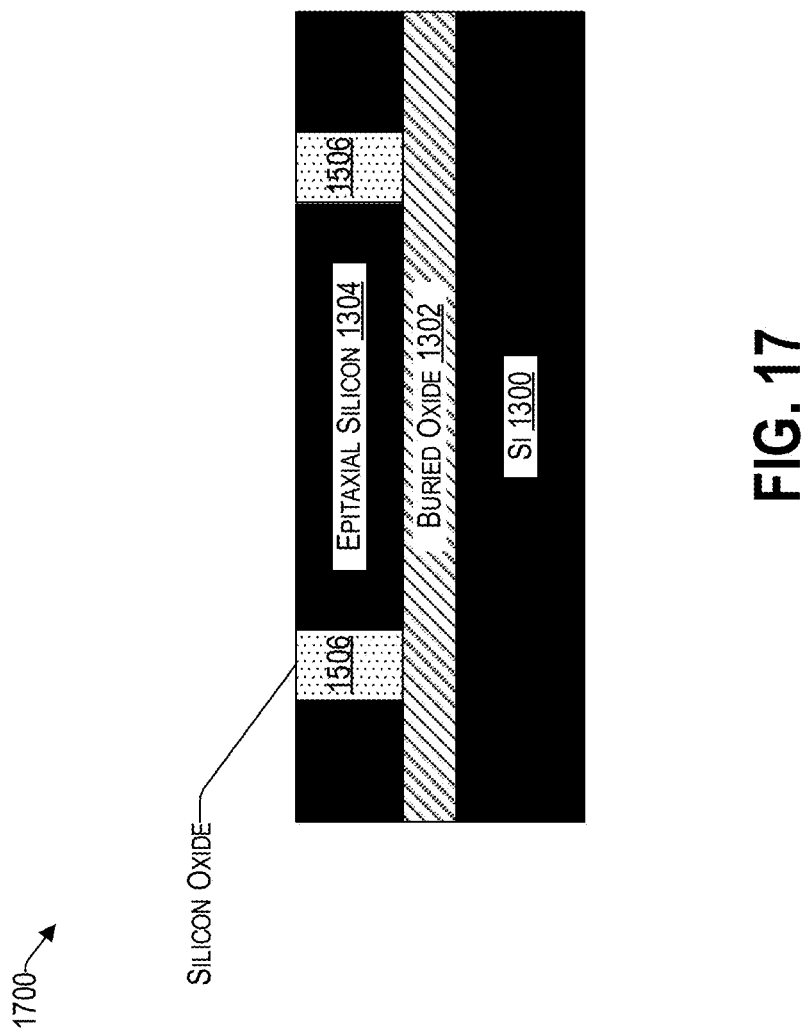
FIG. 17 illustrates a semiconductor structure where the silicon nitride layer is removed.

FIG. 15 illustrates a semiconductor structure 1500 that includes a silicon oxide isolation film 1506 that goes on top of the silicon nitride layer 1306 and fills the openings left behind from the processing step of FIG. 14. In FIG. 16, the silicon oxide that is above the silicon nitride 1306 layer is removed. In one embodiment, CMP is used to remove the silicon oxide 1506 that is not buried below the silicon nitride layer 1306. The silicon nitride layer 1306 is then removed, as illustrated in the semiconductor structure 1700 of FIG. 17.

Figure 18:
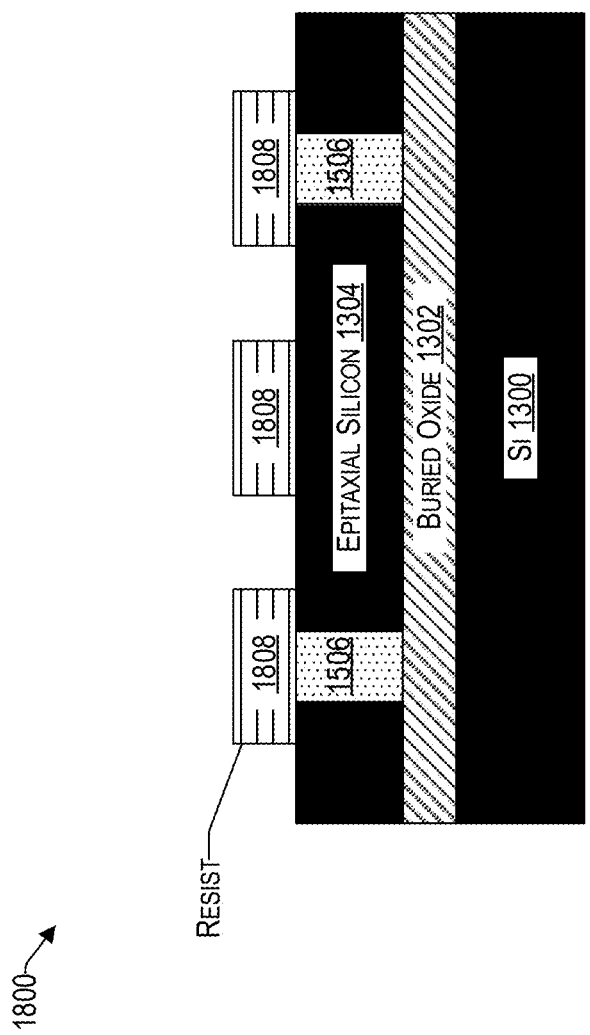
FIG. 18 illustrates a semiconductor structure where an etching mask layer is deposited with an appropriate pattern to provide the outlines of the source and drain implants of the FET devices that are being created.
Figure 19:
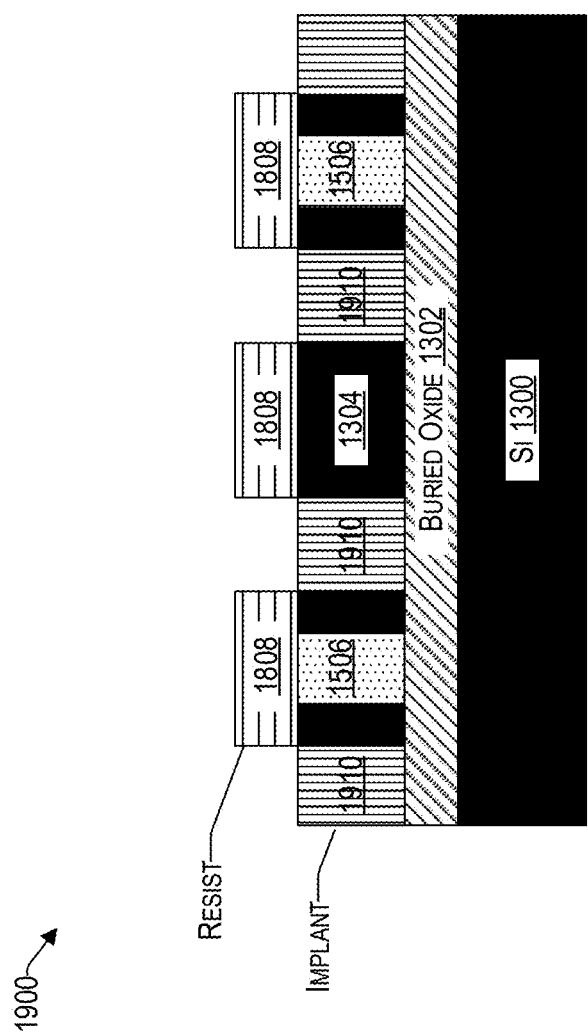
FIG. 19 illustrates source and drain implants that are introduced to the semiconductor structure on top of the buried oxide in the areas that are not protected by the photoresist layer.
Figure 20:
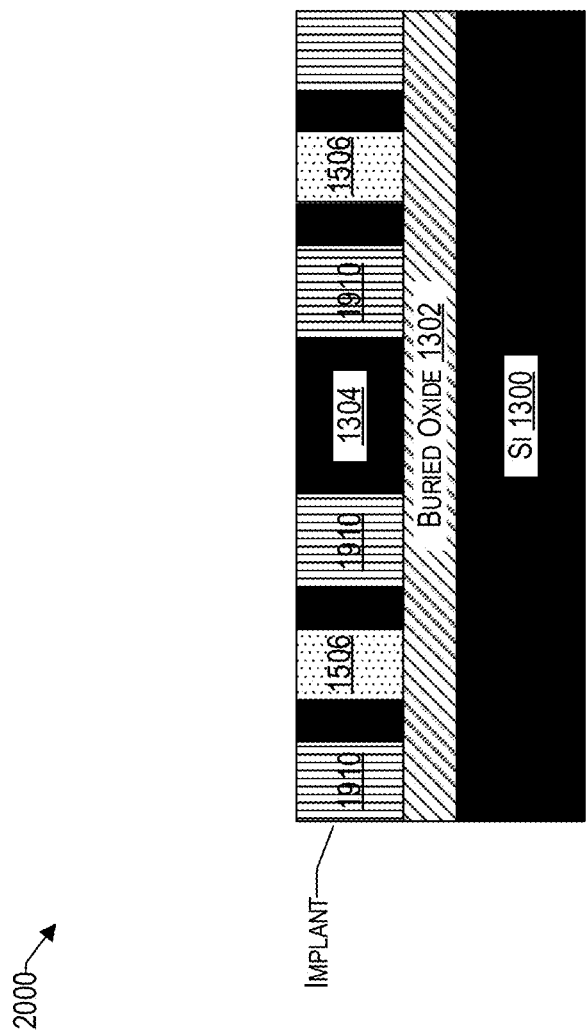
FIG. 20 illustrates a semiconductor structure where the photoresist layer is removed.
Figure 21:
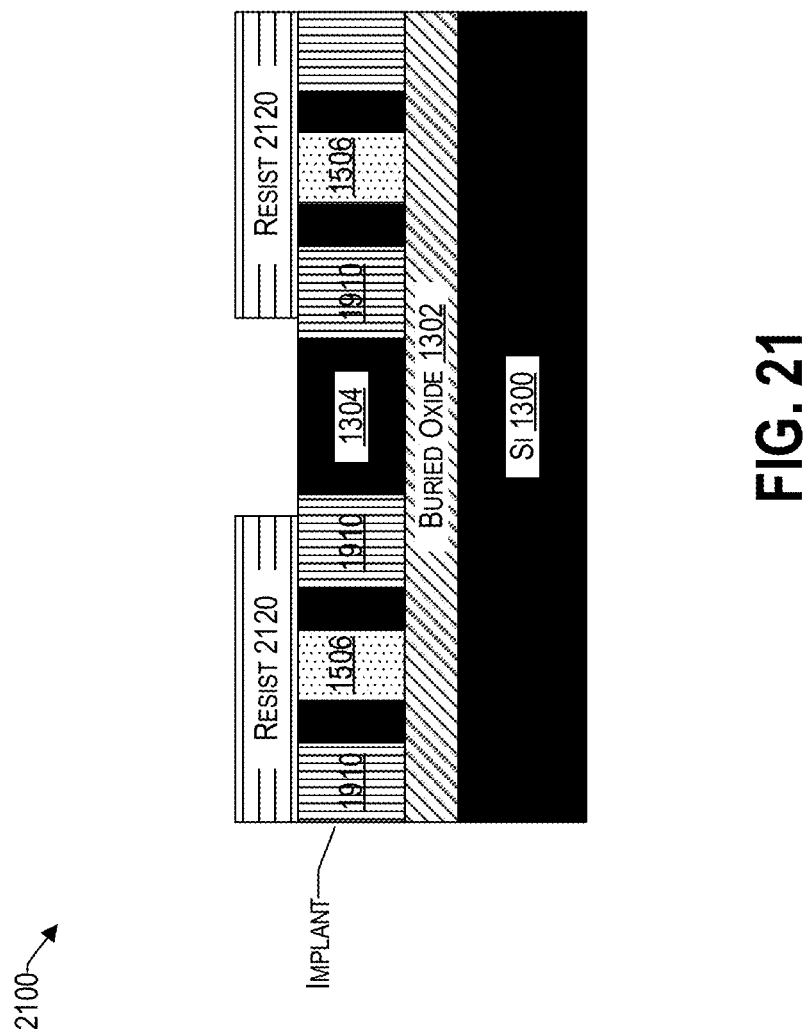
FIG. 21 illustrates a semiconductor structure having a photoresist layer to provide the outlines of a channel implant.

FIG. 18 illustrates a semiconductor structure 1800, where an etching mask layer, represented by photoresist layer 1808, is deposited with an appropriate pattern to provide the outlines of the source and drain implants of the FET devices that are being created. In FIG. 19, the source and drain implants 1910 are introduced to the semiconductor structure 1900 on top of the buried oxide 1302 in the areas that are not protected by the photoresist layer 1808. By way of non-limiting example, phosphorous, arsenic, boron, etc., can be used as the source/drain implant material to make the epitaxial silicon layer 1304 more conductive. The photoresist layer 1808 is then removed using a plasma ashing or stripping process, as illustrated in the semiconductor structure 2000 of FIG. 20. Instead, a new photoresist layer 2120 is deposited to provide the outlines of the channel implant, as illustrated in the semiconductor structure 2100 of FIG. 21.

Figure 22:
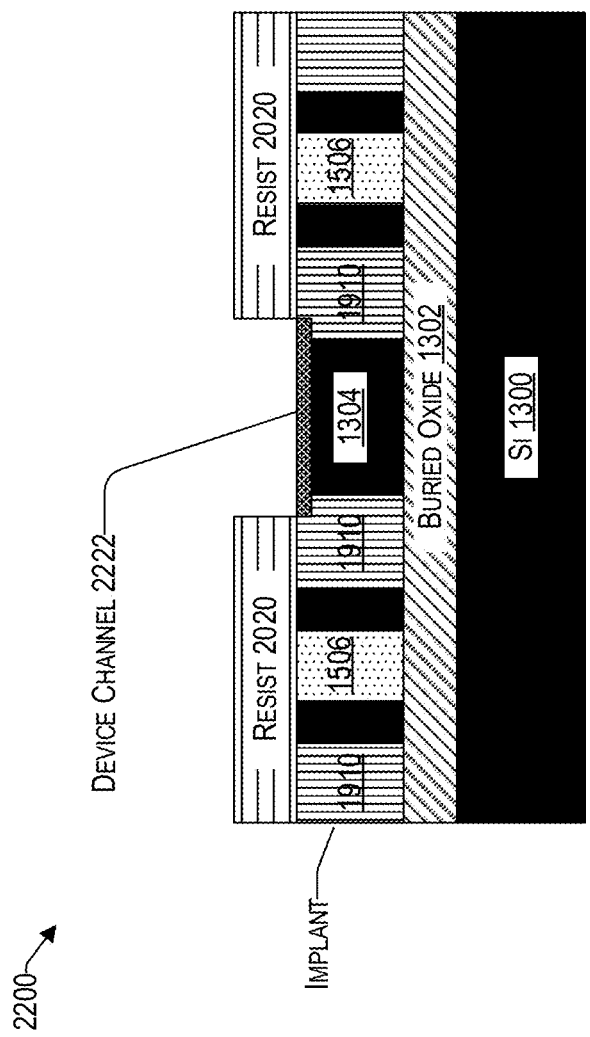
FIG. 22 illustrates a semiconductor device structure that includes a device channel on top of the epitaxial silicon layer and parts of the drain/source implants that are not protected by the photoresist.
Figure 23:
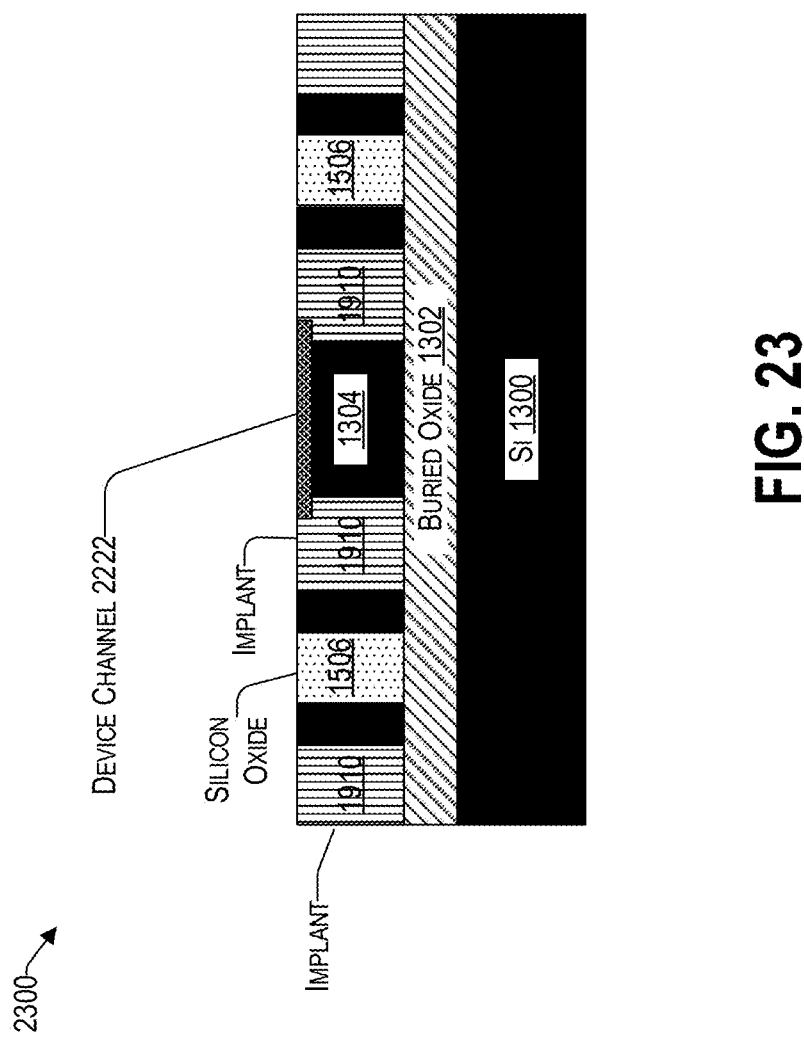
FIG. 23 illustrates a semiconductor structure where the photoresist layer is removed.

FIG. 22 illustrates a semiconductor device structure 2200 that includes a device channel 2222 on top of the epitaxial silicon layer 1304 and parts of the drain/source implants 1910 that are not protected by the photoresist 2020. The photoresist layer 2020 is then removed using a plasma ashing or stripping process, as illustrated in the semiconductor structure 2300 of FIG. 23.

Figure 24:
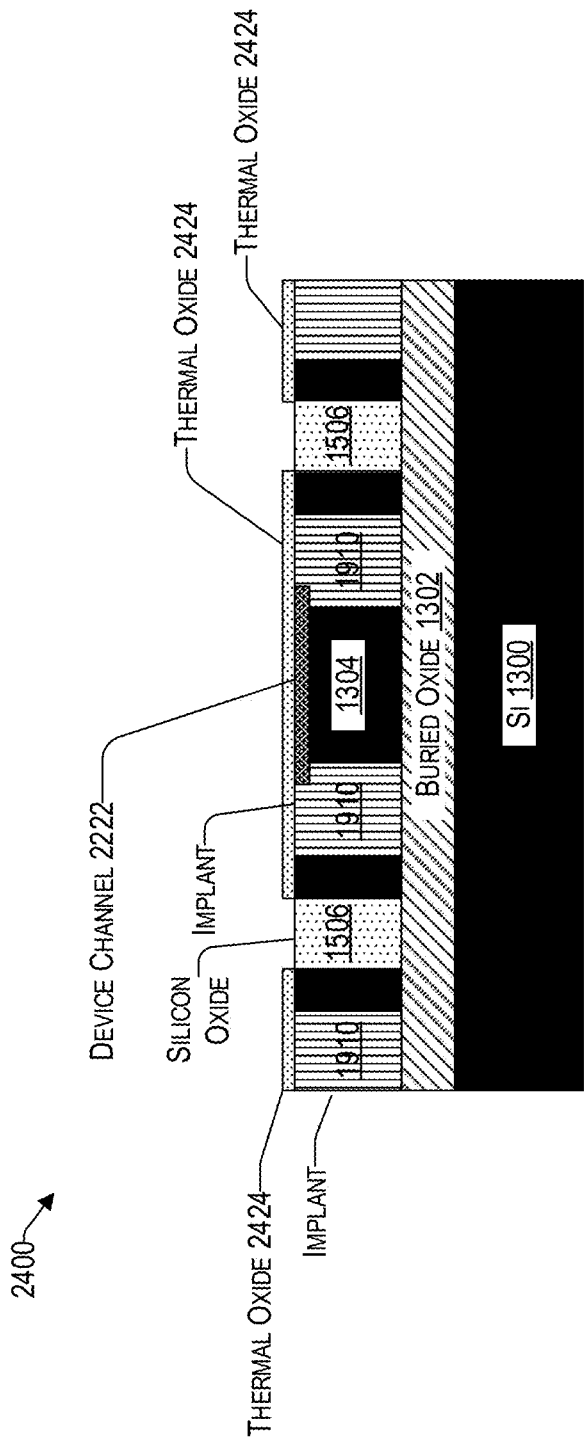
FIG. 24 illustrates a semiconductor structure that includes a high-quality thermal oxide.

FIG. 24 illustrates a semiconductor structure 2400 that includes a high-quality thermal oxide 2424 that, in one embodiment, is 2 to 3 nm thick. The thermal oxide 2424 is of high-quality because it does not have substantive defects, such as pin-holes or lattice defects. Stated differently, the defect density is below $10^{11}$ per $cm^2$ at the interface of silicon dioxide and silicon. That is because, unlike known oxide layers that are thinned by CMP, the thermal oxide layer 2424 discussed herein is thermally grown, which provides substantially better control over the thickness of the thermal oxide layer 2424 over the entire wafer. In this way, threshold voltage variation between FETs and hysteresis concerns of FETs are significantly reduced.

Figure 25:
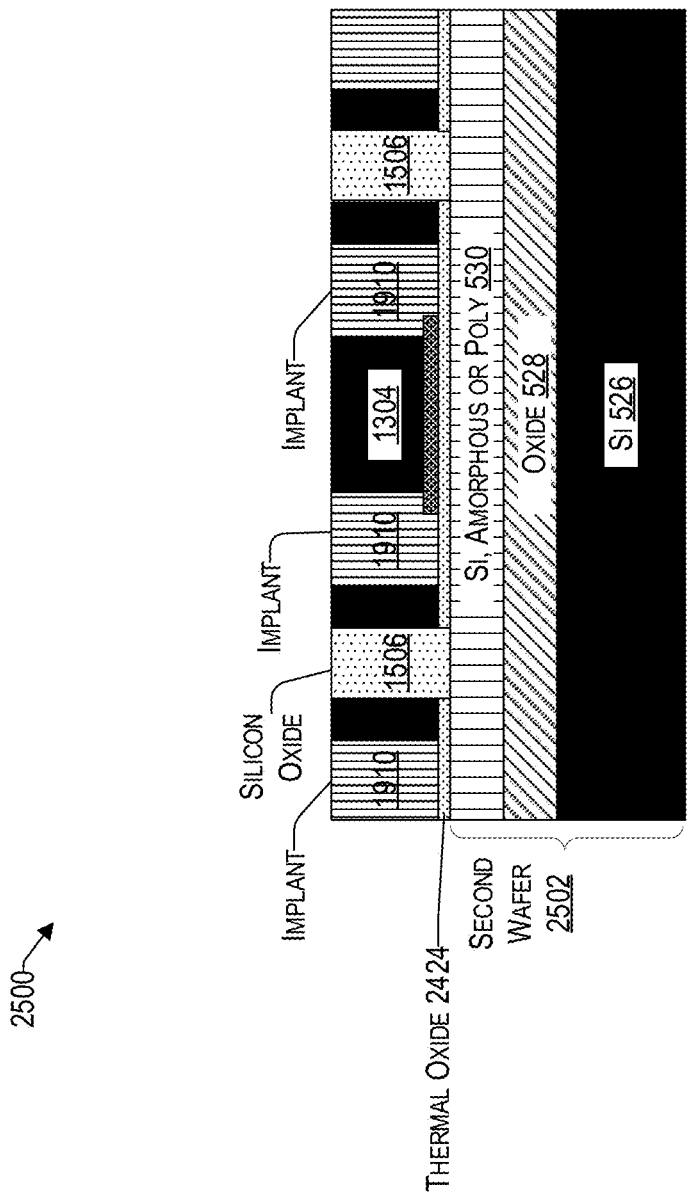
FIG. 25 illustrates a semiconductor structure wherein the semiconductor structure of FIG. 24 has been coupled to a second wafer, consistent with an illustrative embodiment.

The buried oxide 1302 and the substrate (i.e., Si) 1300 are removed to expose the opposite side of the silicon devices layer. As used in the context of FIG. 24, opposite refers to the position of the thermal oxide layer 2424. The resulting semiconductor structure is then flipped upside down, such that the side of the thermal oxide 2424 faces a second wafer. In this regard, FIG. 25 illustrates a semiconductor structure 2500, wherein the semiconductor structure 2400 of FIG. 24 has been coupled to a second wafer 2502, consistent with an illustrative embodiment. The second wafer 2502 is used as a vessel for further processing the top wafer, but will ultimately be discarded to expose the high-quality thermal oxide 2424. More particularly, the further processing includes growing contacts and wires from the opposite side of the first wafer, such that the drain and source of each FET can be monitored and/or controlled.

Figure 26:
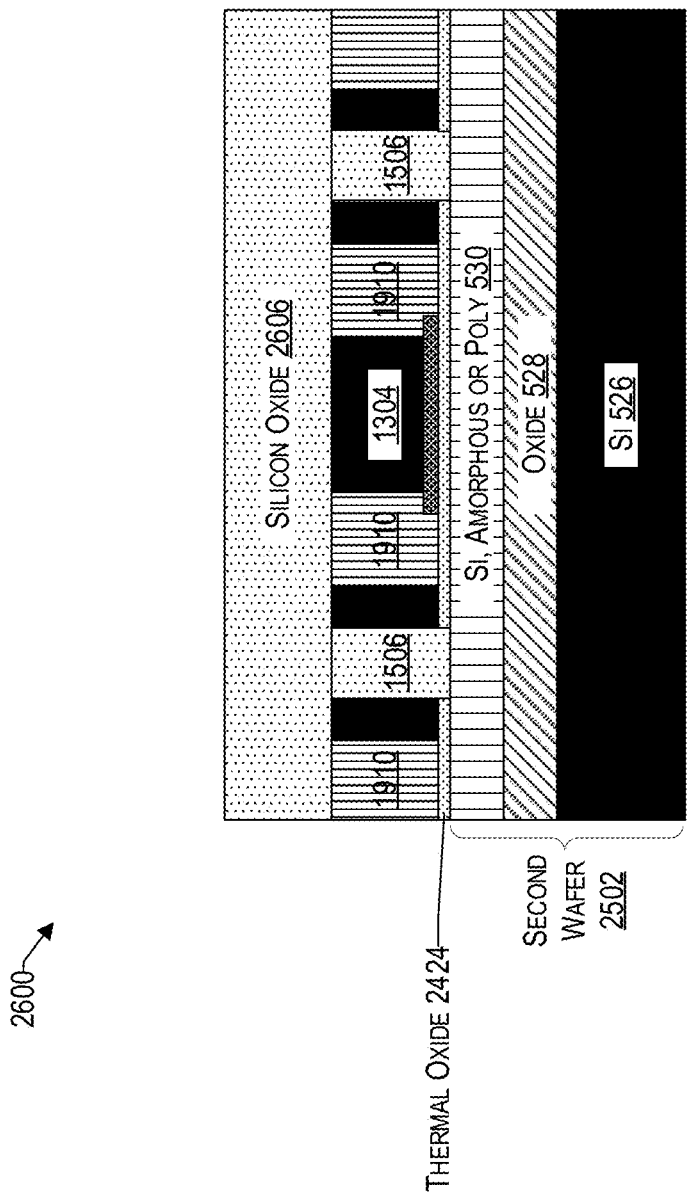
FIG. 26 illustrates a silicon oxide layer deposited on the top side of a semiconductor structure.

In FIG. 26, a silicon oxide layer 2606 is deposited on the now "top" side of the semiconductor structure 2600, which is opposite to that of the substrate (i.e., Si) 526 of the second wafer 2502.

Figure 27:
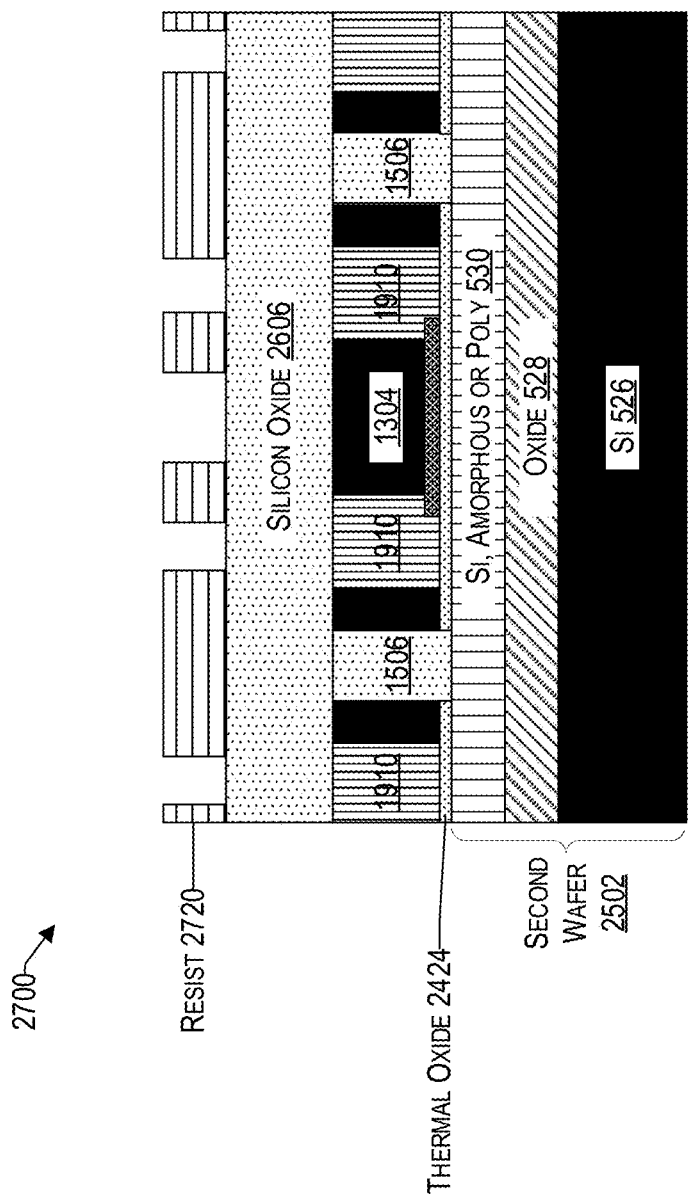
FIG. 27 illustrates a semiconductor structure where an etching mask layer is deposited with an appropriate pattern to provide the outlines of vias for the field effect transistor devices.
Figure 28:
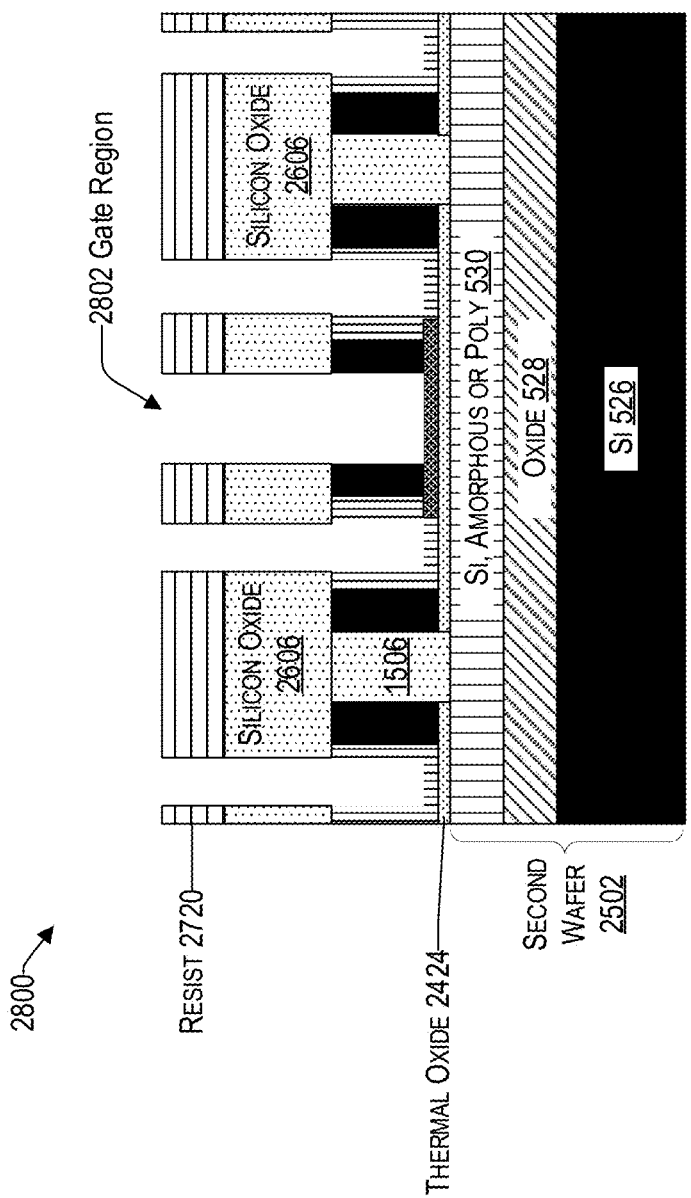
FIG. 28 illustrates a semiconductor structure where the silicon oxide layer and at least part of the implant layer are removed from areas that are not protected by a photoresist layer.

FIG. 27 illustrates a semiconductor structure 2700 where an etching mask layer, represented by photoresist layer 2720, is deposited with an appropriate pattern to provide the outlines of the vias for the FET devices. In FIG. 28, the silicon oxide layer 2606 and at least part of the implant layer 1910 are removed from areas that are not protected by the photoresist layer 2720. An etching process, such as a reactive ion etch (ME), may be used to form patterns (e.g., openings) by removing portions of the silicon oxide layer 2606 and the implant layer 1910. In this way, the drain and source via regions are exposed. In some embodiments the gate region 2802 of the FET is not etched. Stated differently, the photoresist layer 2720 may cover the gate region 2802, thereby preventing it from being etched. That is because, in some embodiments, a separate gate is not necessary, since the aqueous solution in contact with the gate oxide forms the gate. Stated differently, the bio liquid is itself the channel and we have a reference electrode in the solution that acts as the device contact. Upon completion of the etching, since the photoresist layer 2720 is no longer needed, the photoresist layer 2720 is removed, as illustrated in the semiconductor structure 2800 of FIG. 28.

Figure 29:
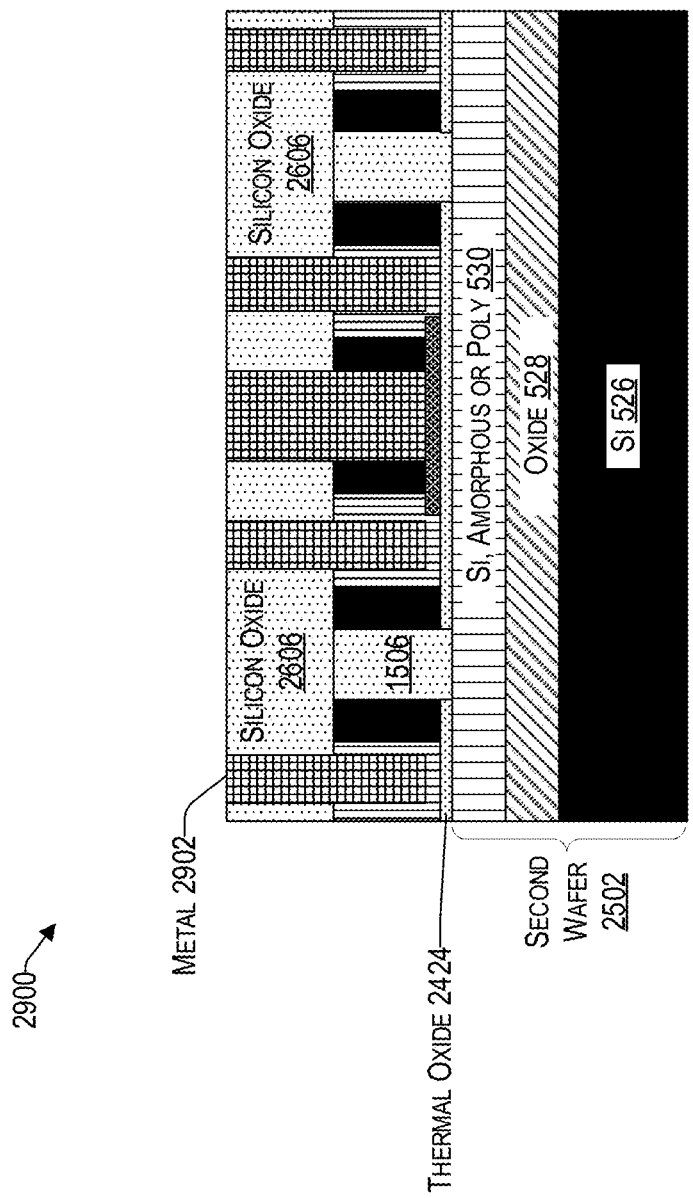
FIG. 29 illustrates a semiconductor structure where gaps that are left behind by the etching process discussed in the context of FIG. 28, are filled with a metal.
Figure 30:
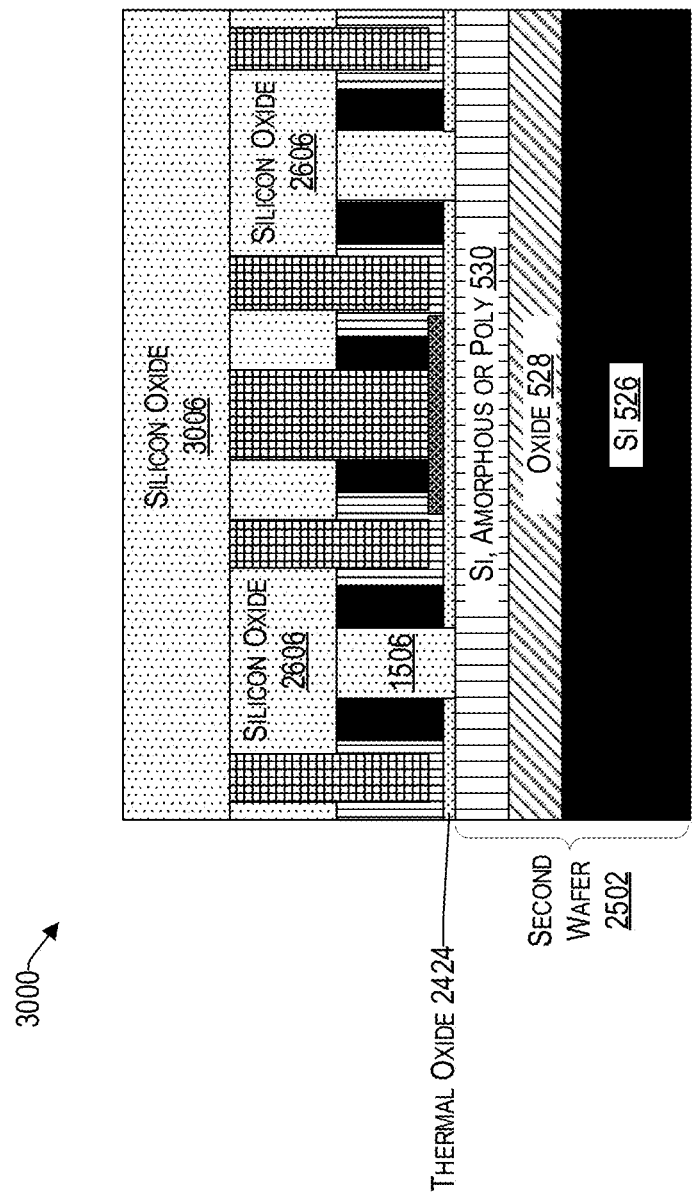
FIG. 30 illustrates a semiconductor structure where a silicon oxide layer is deposited on top of the semiconductor structure.
Figure 31:
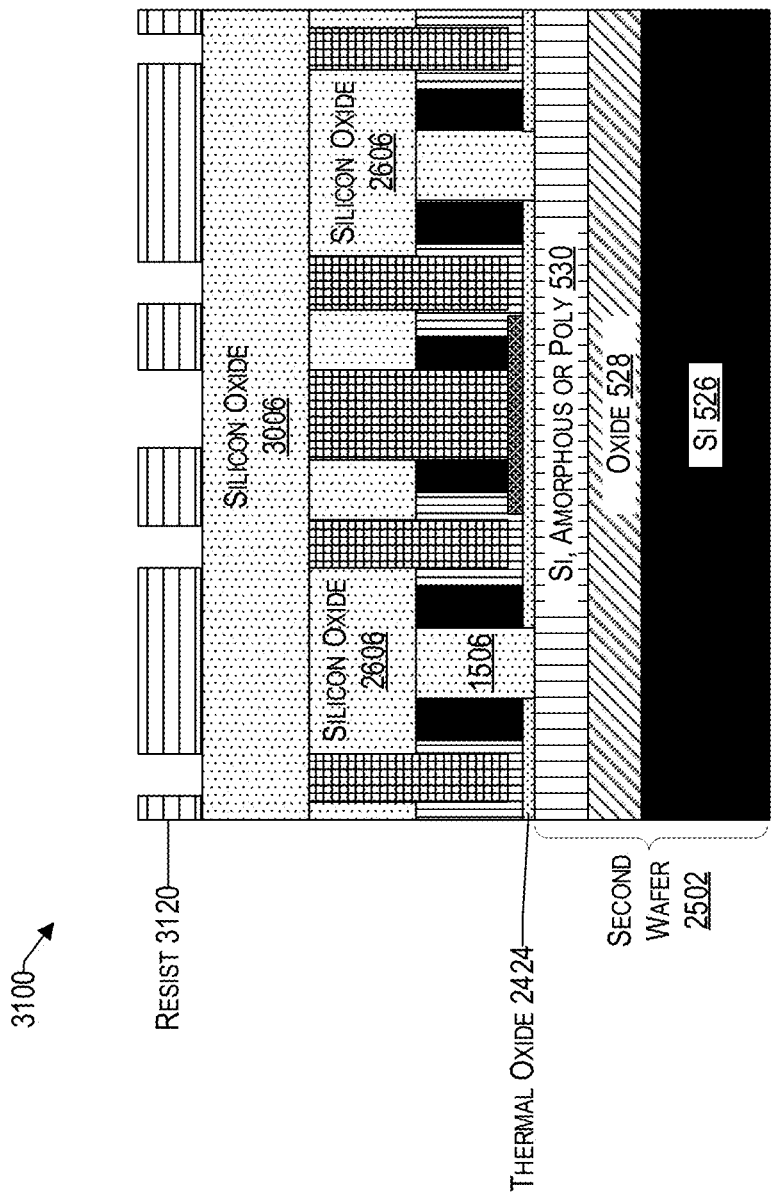
FIG. 31 illustrates a semiconductor structure with a photoresist layer having an appropriate pattern to provide the outlines for wiring.

The gaps that are left behind by the etching process discussed in the context of FIG. 28, are filled with a metal, such as, without limitation, tungsten, doped silicon, graphene, aluminum (Al), titanium (Ti), platinum (Pt), and/or gold (Au), or a combination thereof, as illustrated in the semiconductor structure 2900 of FIG. 29. In FIG. 30, a silicon oxide layer 3006 is deposited on top of the semiconductor structure 3000. This silicon oxide 3006 will later act as a support structure for a new photoresist. To that end, FIG. 31 illustrates a semiconductor structure 3100 with a photoresist layer 3120 having an appropriate pattern to provide the outlines for wiring. An etching process, such as ME, may be used to form patterns (e.g., openings) by removing portions of the silicon oxide layer 3006, thereby providing access to the metal layer 2902. Upon completion of the etching, since the photoresist layer 2720 is no longer needed, the photoresist layer 3120 is removed, as illustrated in the semiconductor structure 3200 of FIG. 32.

Figure 32:
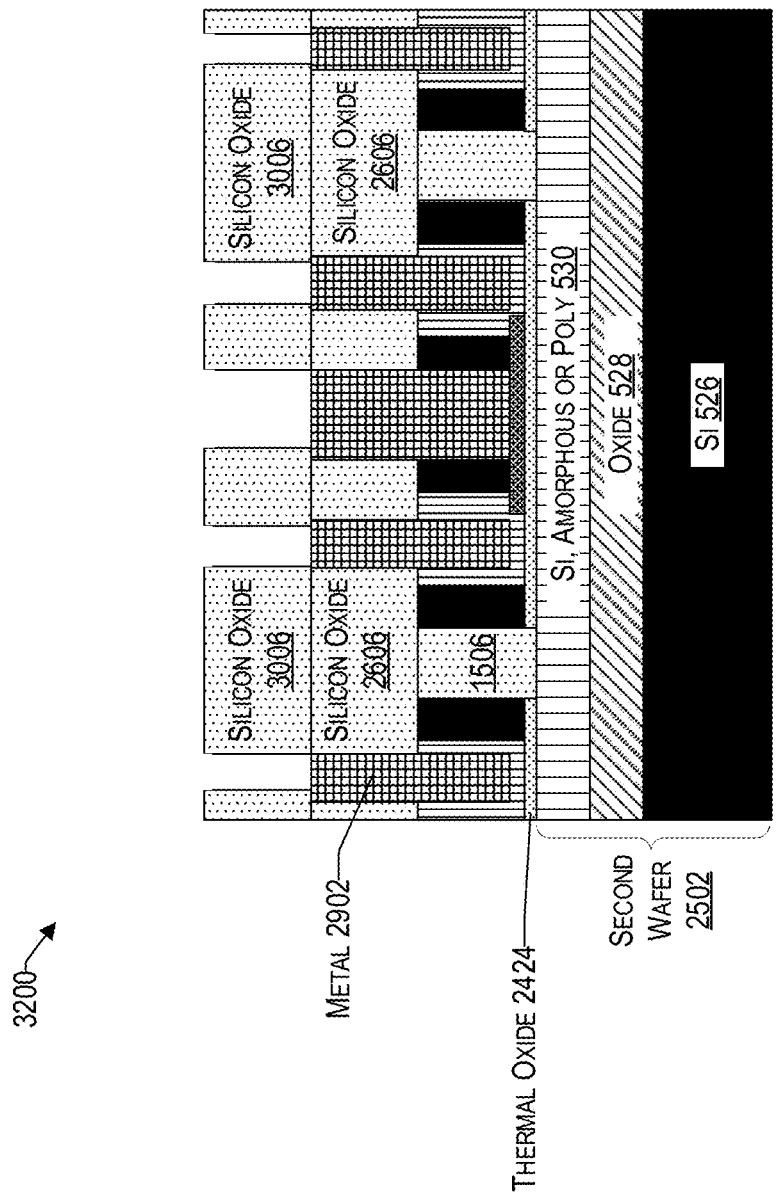
FIG. 32 illustrates a semiconductor structure where the photoresist layer is removed.
Figure 33:
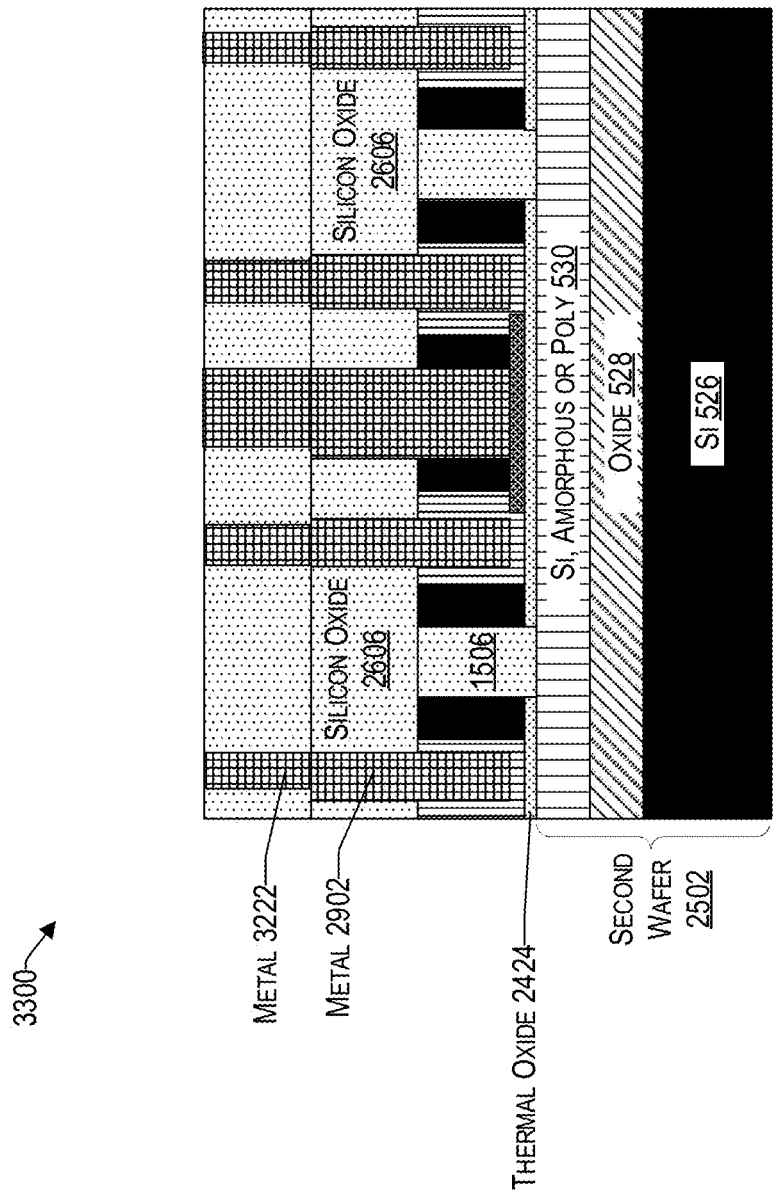
FIG. 33 illustrates a semiconductor structure having an additional metal layer.

The gaps that are left behind by the etching process discussed in the context of FIG. 32, are filled with a metal. In one embodiment, the metal layer 3222 used may be the same as the metal layer 2902, as illustrated in the semiconductor structure 3300 of FIG. 33.

Figure 34:
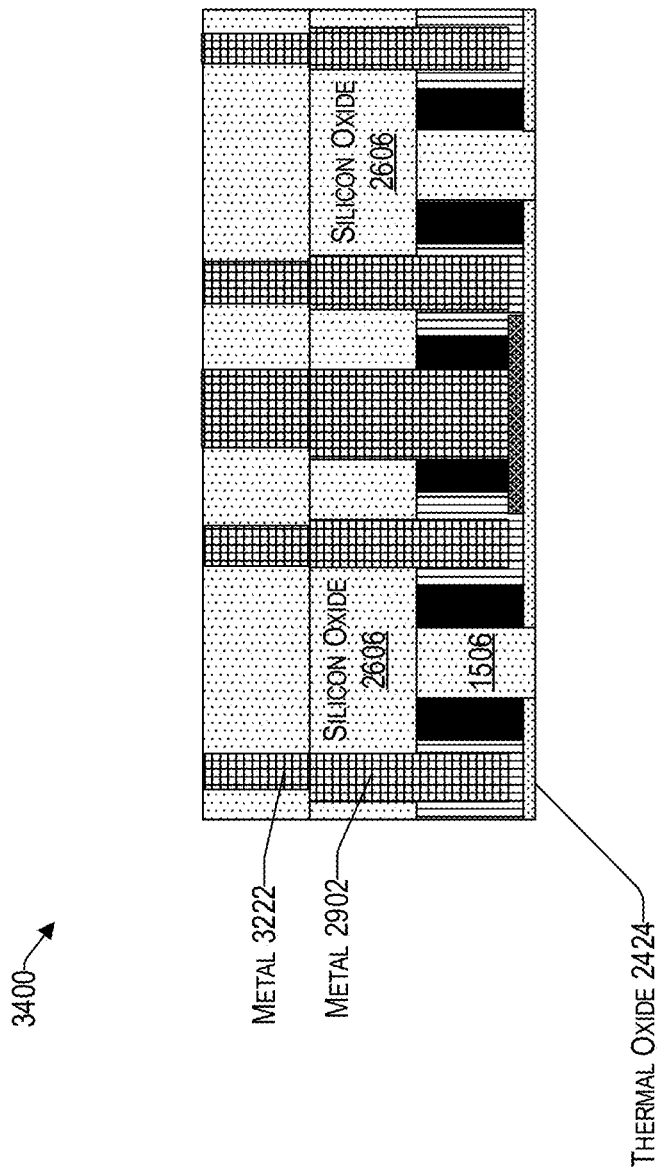
FIG. 34 illustrates a semiconductor structure wherein the second wafer is removed.

FIG. 34 illustrates a semiconductor structure 3400 wherein the second wafer 2502 is removed. More particularly, the amorphous Si or polycrystalline silicon layer 530, the oxide layer 528, and the substrate (i.e., Si) 526 are removed. In this way, the high-quality thermal oxide layer 2424 is exposed and configured to interact with analytes, whereas the opposite side of the first wafer provides access to the drain and source contacts to the FETs. In some embodiments, the opposite side also provides access to the gate of the FET.

Each FET in an electrochemical sensor array discussed herein can act as a data source that is operative to provide individual information. In various embodiments, each electrochemical sensor may be configured to analyze a different analyte or the same analyte. For example, sensors 1 to 10 in an electrochemical sensor array may be operative to measure analyte A, whereas sensors 11 to 20 may be configured to measure analyte B, and so forth.

In some embodiments, each electrochemical sensor is configured to analyze a different analyte or all electrochemical sensors may be configured to analyze the same analyte. In this regard, it is noted that electrochemical sensors that are the same can provide a reinforcement of the determination, thereby increasing the confidence in a measurement. In this way, errors between electrochemical sensors can be tuned out. Alternatively, or in addition, similar electrochemical sensors can provide a distribution of the chemical across the sensing surface. For example, a solution may have different regions of concentration of one or more chemicals, which can be successfully identified at a nanoscale. Stated differently, a map of a spatial distribution of an analyte or different analytes could be studied at a nanoscale granularity. In this way, the electrochemical sensors discussed herein can provide a stable, efficient (i.e., rapid), and accurate measurement of a range of ionic species in biological fluids.

By virtue of the wiring and contacts being on a side that is opposite to that of the thermal oxide (that acts as an interface with the analyte) a substantial improvement in electrochemical sensor array density can be provided. Stated differently, the FETs of the electrochemical sensor array are more densely packed, thereby allowing a nanoscale granularity in measurement between sensors. For example, a nanoscale two-dimensional map of a subject biological tissue can be provided. Of course, the electrochemical sensor arrays discussed herein can also be used to provide measurements over time (e.g., predetermined intervals) to provide a temporal distribution of a cell membrane activity.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products, including medical products.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An electrochemical sensor array, comprising:
   a thermal oxide configured to interface with one or more analytes;
   a transistor device layer comprising a plurality of field effect transistors (FETs) on top of the thermal oxide; and
   a contact and wiring structure layer on top of and in contact with a bottom surface of the transistor device layer and operative to couple to control nodes of each of the plurality of FETs, wherein the contact and wiring structure are on a side opposite to that of the thermal oxide with respect to the transistor device layer.

2. The electrochemical sensor of claim 1, further comprising a support layer on top of the contact and wiring structure layer and configured to provide support for the electrochemical sensor array.

3. The electrochemical sensor of claim 1, wherein the plurality of FETs is operative to provide a spatial mapping of a membrane protein activity in living cells through the contacts and wiring structure layer.

4. The electrochemical sensor of claim 1, wherein the plurality of FETs is configured to selectively sense concentrations of ionic biomolecules at a nanoscale granularity.

5. The electrochemical sensor of claim 1, wherein the plurality of FETs is divided into different groups, wherein each group is configured to analyze a different analyte.

6. The electrochemical sensor of claim 1, wherein the thickness of the thermal oxide is between 2 nm to 3 nm.

7. The electrochemical sensor of claim 1, wherein the transistor device layer comprises, for each of the plurality of FETs, a gate, a drain, and a source of the FET.

8. The electrochemical sensor of claim 1, wherein each of the plurality of FETs is a Fin Field Effect Transistor.

9. The electrochemical sensor of claim 1, wherein the plurality of FETs is configured to provide a distribution of one or more analytes across a sensing surface of the thermal oxide.

* * * * *